United States Patent
Tischler

(10) Patent No.: US 9,478,715 B2
(45) Date of Patent: Oct. 25, 2016

(54) DISCRETE PHOSPHOR CHIPS FOR LIGHT-EMITTING DEVICES AND RELATED METHODS

(71) Applicant: Michael A. Tischler, Vancouver (CA)

(72) Inventor: Michael A. Tischler, Vancouver (CA)

(73) Assignee: Cooledge Lighting Inc., Richmond (CA)

( * ) Notice: Subject to any disclaimer, the term of this patent is extended or adjusted under 35 U.S.C. 154(b) by 0 days.

(21) Appl. No.: 14/180,602

(22) Filed: Feb. 14, 2014

(65) Prior Publication Data

US 2014/0227812 A1  Aug. 14, 2014

Related U.S. Application Data

(63) Continuation of application No. 13/746,574, filed on Jan. 22, 2013, now abandoned.

(60) Provisional application No. 61/589,908, filed on Jan. 24, 2012, provisional application No. 61/589,909, filed on Jan. 24, 2012.

(51) Int. Cl.
*H01L 33/50* (2010.01)
*H01L 33/00* (2010.01)
(Continued)

(52) U.S. Cl.
CPC ............ *H01L 33/501* (2013.01); *H01L 24/96* (2013.01); *H01L 24/97* (2013.01); *H01L 25/0753* (2013.01); *H01L 27/14* (2013.01); *H01L 27/15* (2013.01); *H01L 27/156* (2013.01); *H01L 29/00* (2013.01); *H01L 31/0203* (2013.01); *H01L 31/02322* (2013.01); *H01L 31/02327* (2013.01); *H01L 31/022425* (2013.01); *H01L 31/048* (2013.01); *H01L 31/055* (2013.01); *H01L 33/00* (2013.01); *H01L 33/005* (2013.01); *H01L 33/10* (2013.01); *H01L 33/486* (2013.01); *H01L 33/50* (2013.01); *H01L 33/502* (2013.01); *H01L 33/505* (2013.01); *H01L 33/507* (2013.01); *H01L 33/54* (2013.01); *H01L 33/58* (2013.01); *H01L 33/60* (2013.01); *H01L 33/62* (2013.01);
(Continued)

(58) Field of Classification Search
CPC .......... H01L 2924/00014; H01L 2924/12041; H01L 33/64; Y10T 29/49165
USPC .................. 445/24–25; 257/98, 40; 313/498, 313/501–512
See application file for complete search history.

(56) References Cited

U.S. PATENT DOCUMENTS 4,335,501 A     6/1982  Wickenden et al.
5,631,191 A *   5/1997  Durand et al. ................ 438/119
(Continued)

FOREIGN PATENT DOCUMENTS

CN    2788361 Y      6/2006
EP    1326289 A2     7/2003
(Continued)

OTHER PUBLICATIONS

International Search Report mailed Sep. 24, 2013 for International Application No. PCT/US2013/022899 (8 pages).
(Continued)

*Primary Examiner* — Tracie Y Green
(74) *Attorney, Agent, or Firm* — Morgan, Lewis & Bockius LLP

(57) ABSTRACT

In accordance with certain embodiments, phosphor chips are formed and subsequently attached to light-emitting elements.

30 Claims, 8 Drawing Sheets

(51) Int. Cl.

| | | |
|---|---|---|
| *H01L 27/14* | (2006.01) | |
| *H05B 33/12* | (2006.01) | |
| *H01L 25/075* | (2006.01) | |
| *H01L 33/48* | (2010.01) | |
| *H01L 23/00* | (2006.01) | |
| *H01L 33/10* | (2010.01) | |
| *H05B 33/02* | (2006.01) | |
| *H01L 29/00* | (2006.01) | |
| *H01L 27/15* | (2006.01) | |
| *H01L 31/0232* | (2014.01) | |
| *H01L 31/0203* | (2014.01) | |
| *H01L 31/0224* | (2006.01) | |
| *H01L 31/048* | (2014.01) | |
| *H01L 31/055* | (2014.01) | |
| *H01L 33/54* | (2010.01) | |
| *H01L 33/58* | (2010.01) | |
| *H01L 33/60* | (2010.01) | |
| *H01L 33/62* | (2010.01) | |
| *H01L 21/00* | (2006.01) | |
| *H01L 33/44* | (2010.01) | |
| *H01L 25/00* | (2006.01) | |

(52) U.S. Cl.
CPC .............. *H05B 33/02* (2013.01); *H05B 33/12* (2013.01); *H01L 21/00* (2013.01); *H01L 25/00* (2013.01); *H01L 33/44* (2013.01); *H01L 2924/01005* (2013.01); *H01L 2924/07802* (2013.01); *H01L 2924/07811* (2013.01); *H01L 2924/12032* (2013.01); *H01L 2924/12041* (2013.01); *H01L 2924/12042* (2013.01); *H01L 2924/12043* (2013.01); *H01L 2924/181* (2013.01); *H01L 2933/005* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 6,066,861 A | 5/2000 | Hohn et al. | |
| 6,087,680 A | 7/2000 | Gramann et al. | |
| 6,274,399 B1 | 8/2001 | Kern et al. | |
| 6,498,051 B1 | 12/2002 | Watanabe | |
| 6,635,987 B1 | 10/2003 | Wojnarowski et al. | |
| 6,649,440 B1 | 11/2003 | Krames et al. | |
| 6,733,711 B2 | 5/2004 | Durocher et al. | |
| 6,751,898 B2 | 6/2004 | Heropoulos et al. | |
| 6,949,772 B2 | 9/2005 | Shimizu et al. | |
| 7,083,993 B2 | 8/2006 | Erchak et al. | |
| 7,084,434 B2 | 8/2006 | Erchak et al. | |
| 7,163,327 B2 | 1/2007 | Henson et al. | |
| 7,166,870 B2 | 1/2007 | Erchak et al. | |
| 7,208,769 B2 | 4/2007 | Guenther et al. | |
| 7,225,538 B2 | 6/2007 | Eldridge et al. | |
| 7,235,817 B2 | 6/2007 | Yano et al. | |
| 7,250,611 B2 | 7/2007 | Aguirre et al. | |
| 7,252,408 B2 | 8/2007 | Mazzochette et al. | |
| 7,256,483 B2 | 8/2007 | Epler et al. | |
| 7,322,718 B2 | 1/2008 | Setomoto et al. | |
| 7,329,887 B2 | 2/2008 | Henson et al. | |
| 7,344,296 B2 | 3/2008 | Matsui et al. | |
| 7,344,902 B2 | 3/2008 | Basin et al. | |
| 7,352,011 B2 | 4/2008 | Smits et al. | |
| 7,375,381 B2 | 5/2008 | Shimizu et al. | |
| 7,397,177 B2 | 7/2008 | Takahashi et al. | |
| 7,400,439 B2 | 7/2008 | Holman | |
| 7,456,805 B2 | 11/2008 | Ouderkirk et al. | |
| 7,488,621 B2 | 2/2009 | Epler et al. | |
| 7,524,206 B2 | 4/2009 | Gutierrez et al. | |
| 7,658,526 B2 | 2/2010 | Henson et al. | |
| 7,666,715 B2 | 2/2010 | Brunner et al. | |
| 7,710,045 B2 | 5/2010 | Schultz et al. | |
| 7,766,518 B2 | 8/2010 | Piepgras et al. | |
| 7,868,341 B2 | 1/2011 | Diana et al. | |
| 1,008,511 A1 | 4/2011 | Inditsky | |
| 1,090,696 A1 | 4/2011 | Nagai et al. | |
| 7,952,107 B2 | 5/2011 | Daniels et al. | |
| 7,967,652 B2 | 6/2011 | Emerson | |
| 1,016,368 A1 | 7/2011 | Dau et al. | |
| 7,972,875 B2 | 7/2011 | Rogers et al. | |
| 1,020,479 A1 | 8/2011 | Arik et al. | |
| 7,994,529 B2 | 8/2011 | Bierhuizen et al. | |
| 8,004,172 B2 | 8/2011 | Hussell et al. | |
| 8,035,125 B2 | 10/2011 | Abe | |
| 8,049,236 B2 | 11/2011 | Shi et al. | |
| 8,058,088 B2 | 11/2011 | Cannon et al. | |
| 8,058,659 B2 | 11/2011 | Bisberg | |
| 8,064,743 B2 | 11/2011 | Meir et al. | |
| 8,067,884 B2 | 11/2011 | Li | |
| 1,315,956 A1 | 12/2011 | Tischler et al. | |
| 8,072,134 B2 | 12/2011 | Erchak et al. | |
| 8,076,680 B2 | 12/2011 | Lee et al. | |
| 8,089,089 B2 | 1/2012 | Kuo et al. | |
| 8,100,552 B2 | 1/2012 | Spero | |
| 8,115,217 B2 | 2/2012 | Duong et al. | |
| 8,128,272 B2 | 3/2012 | Fine et al. | |
| 8,384,121 B2 | 2/2013 | Tischler et al. | |
| 8,466,488 B2 | 6/2013 | Tischler et al. | |
| 8,772,802 B2* | 7/2014 | Tsai | H01L 33/58 257/81 |
| 2004/0070014 A1 | 4/2004 | Lin et al. | |
| 2004/0105264 A1* | 6/2004 | Spero | 362/276 |
| 2005/0022697 A1 | 2/2005 | Benrashid et al. | |
| 2005/0051782 A1 | 3/2005 | Negley et al. | |
| 2005/0265404 A1 | 12/2005 | Ashdown | |
| 2005/0269582 A1 | 12/2005 | Mueller et al. | |
| 2006/0124955 A1 | 6/2006 | Sakakibara | |
| 2006/0186425 A1 | 8/2006 | Yano et al. | |
| 2007/0013057 A1 | 1/2007 | Mazzochette | |
| 2007/0023769 A1 | 2/2007 | Nishimoto et al. | |
| 2008/0023687 A1 | 1/2008 | Choi et al. | |
| 2008/0048200 A1* | 2/2008 | Mueller et al. | 257/98 |
| 2008/0121911 A1 | 5/2008 | Andrews et al. | |
| 2008/0137106 A1 | 6/2008 | Ono | |
| 2008/0144333 A1 | 6/2008 | Gourlay | |
| 2008/0179611 A1 | 7/2008 | Chitnis et al. | |
| 2008/0217601 A1 | 9/2008 | Erchak et al. | |
| 2008/0225549 A1 | 9/2008 | Dassanayake et al. | |
| 2009/0085464 A1 | 4/2009 | Oguma et al. | |
| 2009/0095963 A1 | 4/2009 | Daniels | |
| 2009/0121250 A1 | 5/2009 | DenBaars et al. | |
| 2009/0129115 A1 | 5/2009 | Fine et al. | |
| 2009/0140272 A1 | 6/2009 | Beeson et al. | |
| 2009/0160043 A1 | 6/2009 | Shen et al. | |
| 2009/0179213 A1 | 7/2009 | Cannon et al. | |
| 2009/0194776 A1 | 8/2009 | Pachler | |
| 2009/0242921 A1 | 10/2009 | Aliyev | |
| 2010/0025700 A1 | 2/2010 | Jung et al. | |
| 2010/0032697 A1 | 2/2010 | Nagai | |
| 2010/0053956 A1* | 3/2010 | Park et al. | 362/235 |
| 2010/0090235 A1* | 4/2010 | Wang et al. | 257/98 |
| 2010/0096977 A1 | 4/2010 | Lee et al. | |
| 2010/0109023 A1 | 5/2010 | Yonehara | |
| 2010/0109025 A1 | 5/2010 | Bhat | |
| 2010/0117099 A1* | 5/2010 | Leung | 257/88 |
| 2010/0127290 A1 | 5/2010 | Joo et al. | |
| 2010/0140655 A1 | 6/2010 | Shi | |
| 2010/0155763 A1 | 6/2010 | Donofrio et al. | |
| 2010/0171215 A1 | 7/2010 | Fischer et al. | |
| 2010/0181582 A1* | 7/2010 | Li et al. | 257/91 |
| 2010/0186883 A1 | 7/2010 | Tomoda | |
| 2010/0213485 A1 | 8/2010 | McKenzie et al. | |
| 2010/0225010 A1 | 9/2010 | Katayama | |
| 2010/0271819 A1 | 10/2010 | Kristoffersen et al. | |
| 2010/0283062 A1 | 11/2010 | Hsieh et al. | |
| 2010/0308354 A1 | 12/2010 | David et al. | |
| 2010/0315817 A1 | 12/2010 | Zimmermann | |
| 2010/0315833 A1 | 12/2010 | Holman et al. | |
| 2010/0317132 A1 | 12/2010 | Rogers et al. | |
| 2010/0320904 A1 | 12/2010 | Meir | |

(56) References Cited

U.S. PATENT DOCUMENTS

| | | |
|---|---|---|
| 2011/0006316 A1 | 1/2011 | Ing et al. |
| 2011/0018014 A1 | 1/2011 | Aanegola et al. |
| 2011/0108874 A1 | 5/2011 | Chu et al. |
| 2011/0136271 A1 | 6/2011 | von Malm |
| 2011/0170289 A1 | 7/2011 | Allen et al. |
| 2011/0186900 A1 | 8/2011 | Watari et al. |
| 2011/0195532 A1 | 8/2011 | Lerman et al. |
| 2011/0198619 A1* | 8/2011 | Chiang et al. .......... 257/88 |
| 2011/0198632 A1 | 8/2011 | Lerman et al. |
| 2011/0198780 A1* | 8/2011 | Basin et al. .......... 264/266 |
| 2011/0215701 A1 | 9/2011 | Tong et al. |
| 2011/0220920 A1 | 9/2011 | Collins et al. |
| 2011/0254042 A1 | 10/2011 | Shaikevitch |
| 2011/0256647 A1 | 10/2011 | Shaikevitch |
| 2011/0284822 A1 | 11/2011 | Jung et al. |
| 2012/0002420 A1 | 1/2012 | Imai et al. |
| 2013/0134445 A1* | 5/2013 | Tarsa et al. .......... 257/88 |
| 2013/0140983 A1* | 6/2013 | Ling et al. .......... 313/512 |
| 2013/0187174 A1 | 7/2013 | Tischler |
| 2013/0187178 A1 | 7/2013 | Tischler |
| 2013/0187540 A1 | 7/2013 | Tischler |

FOREIGN PATENT DOCUMENTS

| | | |
|---|---|---|
| EP | 1418628 A1 | 5/2004 |
| EP | 1693904 A2 | 8/2006 |
| EP | 1770788 | 4/2007 |
| EP | 2117054 A2 | 11/2009 |
| EP | 2369642 A1 | 9/2011 |
| EP | 2393127 A1 | 12/2011 |
| EP | 2410357 A2 | 1/2012 |
| EP | 2423717 A2 | 2/2012 |
| GB | 2447091 A | 9/2008 |
| IL | 34547 A | 5/1983 |
| JP | 02292064 A | 12/1990 |
| JP | 4028269 A | 1/1992 |
| JP | 08167687 A | 6/1996 |
| JP | 09219412 A | 8/1997 |
| JP | 10154784 A | 6/1998 |
| JP | 2000323756 A | 11/2000 |
| JP | 2003277479 A | 10/2003 |
| JP | 2009051107 A | 3/2009 |
| KR | 20100091384 A | 8/2010 |
| KR | 20110127318 A | 11/2011 |
| WO | WO-03017353 A2 | 2/2003 |
| WO | WO-2004093131 A2 | 10/2004 |
| WO | WO-2005029599 A2 | 3/2005 |
| WO | WO-2006127785 A2 | 11/2006 |
| WO | WO-2007062169 A2 | 5/2007 |
| WO | WO-2007143365 A2 | 12/2007 |
| WO | WO-2007149362 A2 | 12/2007 |
| WO | WO-2008051596 A2 | 5/2008 |
| WO | WO-2008100991 A1 | 8/2008 |
| WO | WO-2009060227 A2 | 5/2009 |
| WO | WO-2009081090 A1 | 7/2009 |
| WO | WO-2010030430 A1 | 3/2010 |
| WO | WO-2010045915 A1 | 4/2010 |
| WO | WO-2011141779 A1 | 11/2011 |
| WO | WO-2011153298 A1 | 12/2011 |
| WO | WO-2011163556 A2 | 12/2011 |
| WO | WO-2012000114 A1 | 1/2012 |
| WO | WO-2013005940 A2 | 1/2013 |
| WO | 2013/036561 A2 | 3/2013 |

OTHER PUBLICATIONS

International Search Report mailed Jul. 4, 2013 for International Application No. PCT/US2013/022468 (9 pages).
International Search Report mailed Jul. 11, 2013 for International Application No. PCT/US2013/037110 (5 pages).
PCT International Patent Application No. PCT/US2013/022468, International Preliminary Report on Patentability mailed Aug. 7, 2014, 15 pages.

* cited by examiner

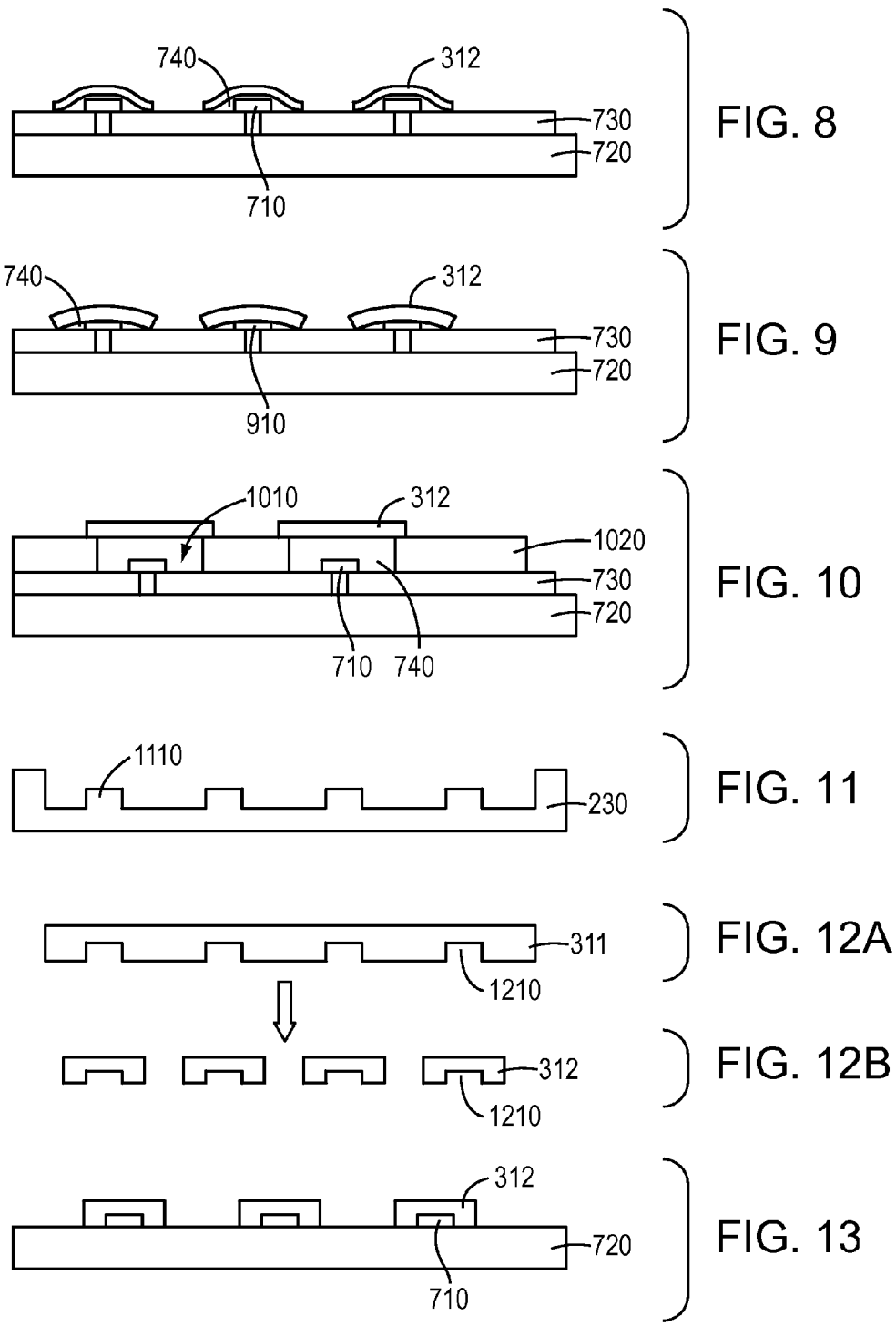

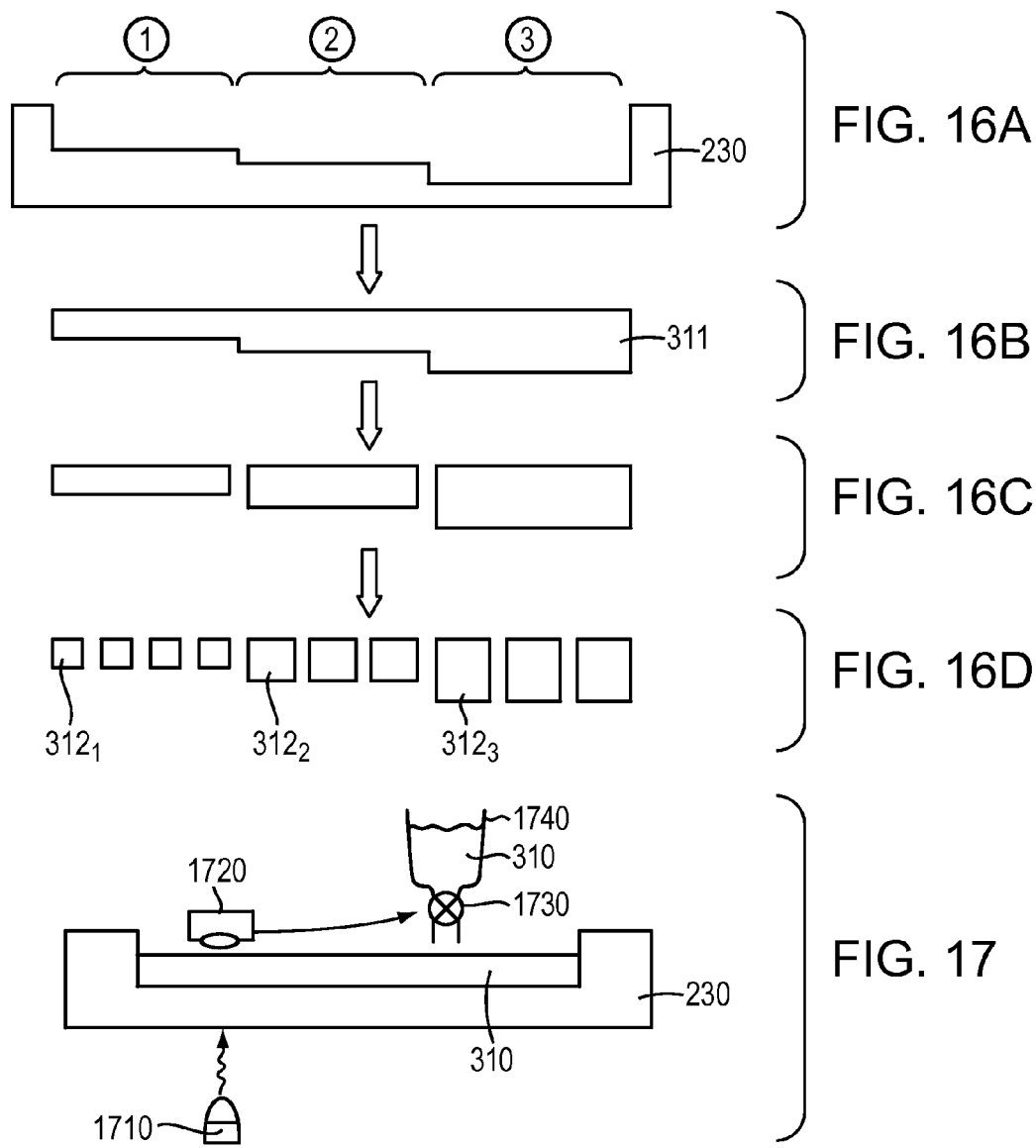

DISCRETE PHOSPHOR CHIPS FOR LIGHT-EMITTING DEVICES AND RELATED METHODS

RELATED APPLICATIONS

This application is a continuation of U.S. patent application Ser. No. 13/746,574, filed Jan. 22, 2013, which claims the benefit of and priority to U.S. Provisional Patent Application No. 61/589,908, filed Jan. 24, 2012, and U.S. Provisional Patent Application No. 61/589,909, filed Jan. 24, 2012, the entire disclosure of each of which is hereby incorporated herein by reference.

FIELD OF THE INVENTION

In various embodiments, the present invention generally relates to light sources, and more specifically to phosphor-converted light sources.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. However, the high cost of LED-based lighting systems has limited their widespread utilization, particularly in broad-area general lighting applications.

The high cost of LED-based lighting systems has several contributors. LEDs are typically encased in a package, and multiple packaged LEDs are used in each lighting system to achieve the desired light intensity. For general illumination, which utilizes white light, such white light may be generated in a number of ways. One approach is to utilize two or more LEDs operating at different wavelengths, where the different wavelengths combine to appear white to the human eye. For example, LEDs emitting in the red, green and blue wavelength ranges may be utilized together. Such an arrangement typically requires careful control of the operating currents of each LED, such that the resulting combination of wavelengths is stable over time and different operating conditions, for example temperature. The different LEDs may also be formed of different materials, for example, AlInGaP for red LEDs and AlInGaN for blue and green LEDs. These different materials may have different operating current requirements as well as different temperature dependencies of the light output power and wavelength. Furthermore, changes in light-output power with time may be different for each type of LED. Therefore, such systems typically utilize some form of active control of the current in each LED to maintain the light output power of each LED at the desired level. In some implementations one or more sensors (for example to sense light intensity, light color, temperature or the like) may be used to provide feedback to the current-control system, while in some other implementations the current may be adjusted over time based on values in a look-up table. Such control systems add cost and complexity to lighting solutions, as well as creating additional failure points. A further disadvantage of multi-LED arrangements is that they typically require some form of light combiner, diffuser or mixing chamber, so that the eye observes white light rather than the discrete different colors of each of the different LEDs. Such light-mixing systems typically add cost and bulk to lighting systems as well as reducing their efficiency.

White light may also be produced in LED-based arrangements for general illumination by means of light-conversion materials such as phosphors. LEDs generally emit in a relatively narrow wavelength range, for example on the order of about 20-100 nm. When broader spectra (for example "white" light) or colors different from that of the LED are desired, the LED may be combined with one or more light-conversion materials. An LED combined with one or more phosphors typically generates white light by combining the short-wavelength emission from the semiconductor LED with long-wavelength emission from the phosphor(s). This occurs because a portion of the LED light passes unconverted through the phosphor to combine with the phosphor-converted light. Phosphors are typically composed of phosphorescent particles such as $Y_3Al_5O_{12}:Ce^{3+}$ (cerium-activated yttrium-aluminum-garnet, or YAG:Ce) embedded in a transparent binder such as optical epoxy or silicone and applied as a layer.

In some implementations, the white light is a combination of the light emitted by the light emitter and the phosphor, while in other implementations the white light is substantially emitted by the phosphor alone (in this case the light from the light emitter is substantially not visible directly by the viewer). Herein, "white light" may be white or any other color that is produced by a combination of light from one or more light emitters and one or more light-conversion materials.

In some implementations, the phosphor layer absorbs a portion of the incident short-wavelength radiant flux and re-emits long-wavelength radiant flux. For an exemplary YAG:Ce phosphor, a blue LED may have a peak wavelength of 450 nm-460 nm, corresponding to the peak of the phosphor-excitation spectrum, while the phosphor emission has a broadband spectrum with a peak at approximately 560 nm. Combining the blue LED emission with the yellow phosphor emission yields visible white light with a specific chromaticity (color) that depends on the ratio of blue light to yellow light.

The geometry of the phosphor relative to the LED generally has a very strong impact on the uniformity of the resulting light. For example, the LED may emit from both the surface and the sides of the LED, producing non-uniform color if the phosphor composition is not uniform over these LED surfaces. To combat this problem, the LED may be placed in a reflecting cavity covered by a wavelength-converting ceramic, with the gap between the LED and the converter optionally filled with a transparent material, such that all of the light from the LED exits the cavity through the converter. However, ceramic wavelength converters may be difficult to manufacture and brittle in thin-film form. Furthermore, they may be expensive to integrate in arrays of small LEDs.

If the thickness of the phosphor layer, formed of a uniformly dispersed phosphor in a binder, is not uniform over the surface of the LED, relatively larger amounts of blue light will be present where the phosphor-infused binder layer is thinner and relatively smaller amounts of blue light will be present where the phosphor-infused binder is thicker. While techniques such as electrophoresis may be utilized to produce a uniform phosphor coating on an LED, electrophoresis typically requires a conductive substrate or an electrically conductive coating, thus increasing cost and complexity.

Phosphor integration typically takes two forms. In one approach the phosphor is integrated in the LED package along with the LED die, while in the other the phosphor is separate from the LED package or LED die. Packaged phosphor-converted LEDs, also known as packaged white LEDs, are typically fabricated by mounting the LED die on a portion of the package followed by integration of the phosphor. In some implementations, the phosphor is mixed with a binder or encapsulant formed over the mounted LED die and optionally over other portions of the package. It is desirable to be able to produce packaged white LEDs with relatively narrow distributions of electrical and optical characteristics, for example forward voltage, luminous flux, luminous efficacy, color temperature, color rendering index (CRI) and the like. However, there is a relatively large variation in these characteristics for the LED dies themselves due to the growth process for the epitaxial structure and the fabrication process of the LED dies. This variation is difficult to reduce, resulting in the need to test, sort and bin the LED dies for almost all applications. In other words, all of the LED dies are tested and grouped into bins related, typically, to forward voltage, light output power and wavelength. LED dies from specific bins are then chosen, based on the requirements of the particular application, put into a package, followed by formation of the phosphor around all or a portion of the LED die.

As explained above, in order to produce uniform optical properties from the packaged white LEDs, the phosphor process typically must be relatively uniform. In some implementations the phosphor, which is typically a powder, is mixed in a liquid binder and applied to the LED dies. It may be difficult to form a uniform layer of phosphor over the LED dies, resulting in different color temperatures for different packaged white LEDs. Furthermore, the phosphor powder typically has a significantly higher density than the binder, leading to settling of the phosphor powder during manufacture and a resulting variation in color temperature. In practice, packaged white LEDs are tested after manufacture and sorted and binned to produce groups of packaged white LEDs with uniform electrical and optical characteristics. It is clear that this is a complicated and costly process, with the potential for a significant portion of the output having non-optimal characteristics.

Conventional approaches may suffer from heating of the phosphor because the phosphor is in relatively good thermal contact with the LED die. As the phosphor heats up, it may lose efficiency and shift its optical properties, both of which are undesirable. One approach to at least partially mitigating heating of the phosphor is to provide increased thermal separation of the phosphor from the LED. Such an approach is sometimes called a "remote phosphor." Remote phosphor configurations may be incorporated into packaged white LEDs by providing some physical and/or thermal separation of the phosphor from the LED die. One approach is to insert a portion of transparent binder or encapsulant between the phosphor-containing binder and the LED die. While such approaches at least partially mitigate phosphor heating, they result in a more complex and costly structure.

These issues may apply to many types of phosphor-converted light emitters, including single die-packaged devices, multiple die-packaged devices, arrays of packaged LEDs and single or arrays of unpackaged dies to which phosphor is applied.

In view of the foregoing, a need exists for structures, systems and procedures enabling the uniform and low cost integration of phosphors with LEDs.

SUMMARY

In accordance with certain embodiments, phosphor is molded, cured, and, if necessary, divided into free-standing solid portions (or "phosphor chips") that are subsequently attached to light-emitting elements (LEEs) so as to receive light emitted by the LEEs. The molding process enables fabrication of phosphor chips having very low thickness variation. These chips may be textured (for example, to increase light-extraction efficiency), and/or may be rectangular solids. The molding process may be utilized to fabricate multiple phosphor chips simultaneously, either via use of a mold having discrete areas for containing the phosphor or by separating a larger piece of cured phosphor into multiple pieces of desired sizes and shapes.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm, while in other embodiments a LEE has one lateral dimension greater than 500 µm. Exemplary sizes of a relatively small LEE may include about 175 µm by about 250 µm, about 250 µm by about 400 µm, about 250 µm by about 300 µm, or about 225 µm by about 175 µm. Exemplary sizes of a relatively large LEE may include about 1000 µm by about 1000 µm, about 500 µm by about 500 µm, about 250 µm by about 600 µm, or about 1500 µm by about 1500 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. The size of the LEE is not a limitation of the present invention.

As used herein, "phosphor" refers to any material that shifts the wavelengths of light irradiating it and/or that is fluorescent and/or phosphorescent, and is utilized interchangeably with the term "light-conversion material." As used herein, a "phosphor" may refer to only the powder or particles (of one or more different types) or to the powder or particles with the binder. The light-conversion material is incorporated to shift one or more wavelengths of at least a portion of the light emitted by LEEs to other desired wavelengths (which are then emitted from the larger device alone or color-mixed with another portion of the original light emitted by the die). A light-conversion material may include or consist essentially of phosphor powders, quantum dots or the like within a transparent matrix. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention. As used herein, a "phosphor chip" is a discrete piece or layer of phosphor that has been fabricated and cured while unattached to any LEE, and that may be later coupled to an LEE by, e.g., optical bonding or via an optical adhesive.

The binder may also be referred to as an encapsulant or a matrix material. In one embodiment, the binder includes or consists essentially of a transparent material, for example silicone-based materials or epoxy, having an index of refraction greater than 1.35. In one embodiment the phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

Herein, two components such as light-emitting elements, optical elements, and/or phosphor chips being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

In an aspect, embodiments of the invention feature an electronic device that includes or consists essentially of a substrate having a plurality of conductive traces on a surface thereof, a plurality of light-emitting diode (LED) dies, and a plurality of discrete phosphor chips each disposed over an LED die and positioned to receive light therefrom. Each pair of conductive traces is separated on the substrate by a gap therebetween. Each LED die spans a gap between conductive traces and has first and second spaced-apart contacts each electrically coupled to one of the conductive traces defining the gap. (As used herein, a "gap" is a space between traces sufficient to prevent shorting between the traces.) Each phosphor chip is attached to an LED die by an attachment agent discrete from the LED die and the phosphor chip. Each phosphor chip includes or consists essentially of (i) a light-conversion material and (ii) a binder including or consisting essentially of silicone and/or epoxy.

Embodiments of the invention feature one or more of the following features in any of a variety of combinations. The attachment agent may include or consist essentially of a clip and/or a frame attached to the substrate. The attachment agent may include or consist essentially of an adhesion agent adhering the phosphor chip to the LED die. The transmittance of the attachment agent for a wavelength emitted by the LED die may be greater than 90%, or even greater than 95%. The adhesion agent may include or consist essentially of a transfer tape.

The variation in the thicknesses of the phosphor chip (i.e., chip to chip) may be less than ±5%. Each phosphor chip may absorb at least a portion of light emitted from the LED die over which it is disposed and emit converted light having a different wavelength, and the converted light and unconverted light emitted by the LED die may combine to form substantially white light. The substantially white light emitted collectively from the different LED dies and phosphor chips may have a color temperature variation less than four, or even less than two, MacAdam ellipses. The device may include circuitry for powering at least one LED die and/or circuitry for controlling optical output characteristics (e.g., chromaticity, luminous flux, correlated color temperature, color point, and/or color rendering index) of at least one LED die and the phosphor chip disposed thereover. An optical element may be associated with at least one LED die. The first and second contacts may be electrically coupled to conductive traces with a conductive adhesive (e.g., an anisotropic conductive adhesive (ACA)). The ACA may be disposed between the LED die and the substrate, and the ACA may electrically connect a first conductive trace only to the first contact and a second conductive trace, different from the first conductive trace, only to the second contact. A portion of the ACA may be disposed in the gap and may substantially electrically isolate the first contact from the second contact.

The first and second contacts may be electrically coupled to conductive traces with wire bonds and/or solder. Each LED die may include or consist essentially of a bare LED die. The light-conversion material may include or consist essentially of a plurality of phosphor particles. A surface of the phosphor chip may be textured. The phosphor chip may define an indentation into which the LED die is at least partially disposed. The conductive traces may include or consist essentially of silver, gold, aluminum, chromium, copper, and/or carbon. The substrate may include or consist essentially of polyethylene naphthalate, polyethylene terephthalate, polycarbonate, polyethersulfone, polyester, polyimide, polyethylene, and/or paper. The reflectivity of the substrate for a wavelength emitted by the LED die and/or the phosphor chip may be greater than 80%. The transmittance of the substrate for a wavelength emitted by the LED die and/or the phosphor chip may be greater than 80%. The LED die may include or consist essentially of a semiconductor material including or consisting essentially of GaN, AlN, InN, and/or an alloy or mixture thereof.

In another aspect, embodiments of the invention feature an electronic device including or consisting essentially of a light-emitting element and a phosphor chip disposed over the light emitting element and positioned to receive light therefrom. The phosphor chip is attached to the light-emitting element by an attachment agent discrete from the light-emitting element and the phosphor chip. The phosphor chip includes or consists essentially of (i) a light-conversion material and (ii) a binder including or consisting essentially of silicone and/or epoxy.

Embodiments of the invention feature one or more of the following features in any of a variety of combinations. The light-emitting element may be disposed over (and even attached to) a substrate. The attachment agent may include or consist essentially of a clip and/or a frame attached to the substrate. The attachment agent may include or consist essentially of an adhesion agent adhering the phosphor chip to the light-emitting element. The transmittance of the attachment agent for a wavelength emitted by the light-emitting element may be greater than 90%, or even greater than 95%. The adhesion agent may include or consist essentially of a transfer tape.

The phosphor chip may be a rectangular solid having a thickness between 5 μm and 1000 μm. A dimension of the phosphor chip perpendicular to the thickness may be between 100 μm and 5000 μm. The thickness uniformity across the phosphor chip may be better than ±10%, or even better than ±5%. A surface of the phosphor chip may be textured (e.g., roughened). The phosphor chip may define an indentation into which the light-emitting element is at least partially disposed. The device may include a substrate having first and second conductive traces on a surface thereof and separated by a gap therebetween. The light-emitting element may have first and second spaced-apart contacts each electrically coupled to one of the first or second conductive traces. The first and second contacts may both be disposed on a first surface of the light-emitting element. The first and second contacts may be electrically coupled to the first and second conductive traces with a conductive adhesive. The conductive adhesive may include or consist essentially of a substantially isotropic adhesive electrically connecting the first contact only to the first trace and the second contact only to the second trace, and a non-conductive adhesive material may be disposed in the gap. The first and second contacts may be electrically coupled to the first and second conductive traces with an anisotropic conductive adhesive (ACA) electrically connecting the first contact only to the first trace and the second contact only to the second trace. A portion of the ACA may be disposed in the gap and may substantially electrically isolate the first contact from the second contact. The first and second contacts may be electrically coupled to the first and second conductive traces with wire bonds and/or solder. The first and second conductive traces may include or consist essentially of silver, gold, aluminum, chromium, copper, and/or carbon. The substrate may include or consist essentially of polyethylene naphthalate, polyethylene terephthalate, polycarbonate, polyethersulfone, polyester, polyimide, polyethylene, and/or paper. The reflectivity of the substrate for a wavelength emitted by the light-emitting element and/or the phosphor chip may be greater than 80%. The transmittance of the substrate for a wavelength emitted by the light-emitting element and/or the phosphor chip may be greater than 80%.

The phosphor chip may include a plurality of discrete regions, at least one of which includes or consists essentially of the binder and a plurality of phosphor particles. At least one portion may include or consist essentially of only the binder. The light-emitting element may include or consist essentially of a semiconductor material including or consisting essentially of GaN, AlN, InN, and/or an alloy or mixture thereof. The light-emitting element may include or consist essentially of a light-emitting diode. The phosphor chip may have a curved shape.

The electronic device may include one or more additional light-emitting elements and one or more additional phosphor chips each disposed over an additional light-emitting element and positioned to receive light therefrom. The phosphor chip and each additional phosphor chip may each have a thickness, and the variation in the thicknesses of the phosphor chips may be less than ±15%, less than ±10%, or even less than ±5%. Each phosphor chip may absorb at least a portion of light emitted from the light-emitting element over which it is disposed and may emit converted light having a different wavelength, converted light and unconverted light emitted by the light-emitting element combining to form substantially white light. The substantially white light may have a color temperature in the range of 2000K to 10,000K. The substantially white light emitted collectively from the different light-emitting elements and phosphor chips may have a color temperature variation less than four, or even less than two, MacAdam ellipses. The device may include circuitry for powering the light-emitting element and/or circuitry for controlling optical output characteristics (e.g., chromaticity, luminous flux, correlated color temperature, color point, and/or color rendering index) of the light-emitting element and the phosphor chip. An optical element may be associated with the light-emitting element.

In yet another aspect, embodiments of the invention feature a method of forming an illumination system that includes or consists essentially of disposing within a mold a phosphor comprising a binder and a light-conversion material, curing the phosphor, thereafter, removing the cured phosphor from the mold, and attaching at least a portion of the cured phosphor to a light-emitting element, whereby the at least a portion of the cured phosphor is positioned to receive light from the light-emitting element.

Embodiments of the invention feature one or more of the following features in any of a variety of combinations. The at least a portion of the cured phosphor may be attached to the light-emitting element with an attachment agent discrete from the light-emitting element and the cured phosphor. The light-emitting element may be attached to a substrate (e.g., via an adhesive, solder, or wire bonds). The attachment agent may include or consist essentially of a clip and/or a frame attached to the substrate. The attachment agent may include or consist essentially of an adhesion agent (e.g., an adhesive) adhering the at least a portion of the cured phosphor to the light-emitting element. Attaching the at least a portion of the cured phosphor to the light-emitting element may include or consist essentially of (i) applying a first portion of the adhesion agent to the light-emitting element, (ii) applying a second portion of the adhesion agent, chemically different from the first portion, to the at least a portion of the cured phosphor, and (iii) bringing the first and second portions of the adhesion agent into contact. The adhesion agent may be at least partially cured via exposure to at least one of ultraviolet radiation, moisture, air, or heat. The adhesion agent may include or consist essentially of a transfer tape. The transmittance of the adhesion agent for a wavelength emitted by the light-emitting element may be greater than 90%, or even greater than 95%.

Prior to curing the phosphor, a mold cover may be placed over the phosphor. The bottom surface of the mold cover may be substantially parallel to a surface of the mold on which the phosphor is disposed. The mold and the mold cover may collectively define a closed cavity (which may be rectilinear) in which the phosphor is disposed. The cured phosphor may be a rectangular solid having a thickness between 5 μm and 1000 μm. A dimension of the cured phosphor perpendicular to the thickness may be between 10 mm and 1000 mm. The thickness uniformity of the cured phosphor may be better than ±15%, better than ±10%, or even better than ±5%. The mold cover may have include at least one opening therein for permitting flow of uncured phosphor therethrough. A release material (e.g., a release film) may be disposed between the phosphor and at least one of (i) at least a portion of the mold or (ii) at least a portion of the mold cover. At least a portion of the mold and/or at least a portion of the mold cover may be textured. A release material (e.g., a release film) may be disposed between the phosphor and at least a portion of the mold. The release material may include or consist essentially of a mold release film applied to the phosphor and/or the at least a portion of the mold, and/or the release material may be textured.

The mold may include or consist essentially of glass, metal, silicone, thermal release tape, water-soluble tape, mold release film, and/or UV release tape. The light-emitting element may have first and second spaced-apart contacts.

The first and second contacts may be electrically coupled to first and second conductive traces on a substrate, the first and second conductive traces being separated on the substrate by a gap therebetween. The first and second contacts may be electrically coupled to the first and second conductive traces with a conductive adhesive. The conductive adhesive may include or consist essentially of a substantially isotropic conductive adhesive electrically connecting the first contact only to the first trace and the second contact only to the second trace. A non-conductive adhesive material may be disposed in the gap. The conductive adhesive may be an anisotropic conductive adhesive (ACA) electrically connecting the first contact only to the first trace and the second contact only to the second trace. A portion of the ACA may be disposed in the gap and may substantially isolate the first contact from the second contact. The electrical coupling may include or consist essentially of wire bonding and/or soldering. The first and second conductive traces may include or consist essentially of silver, gold, aluminum, chromium, copper, and/or carbon. The substrate may include or consist essentially of polyethylene naphthalate, polyethylene terephthalate, polycarbonate, polyethersulfone, polyester, polyimide, polyethylene, and/or paper. The reflectivity of the substrate for a wavelength emitted by the light-emitting element and/or the cured phosphor may be greater than 80%. The transmittance of the substrate for a wavelength emitted by the light-emitting element and/or the cured phosphor may be greater than 80%. The light-emitting element may include or consist essentially of a semiconductor material including or consisting essentially of GaN, AlN, InN, and/or an alloy or mixture thereof. The light-emitting element may include or consist essentially of a light-emitting diode.

The cured phosphor may absorb at least a portion of light emitted from the light-emitting element and may emit converted light having a different wavelength, converted light and unconverted light emitted by the light-emitting element combining to form substantially white light. The substantially white light may have a color temperature in the range of 2000 K to 10,000 K. The cured phosphor may include or consist essentially of a plurality of discrete regions, at least one of which includes or consists essentially of the binder and phosphor particles. At least one of the regions may include or consist essentially of only the binder. A surface of the mold may include a plurality of raised portions whereby a plurality of indentations are formed in the cured phosphor. Disposing the at least a portion of the cured phosphor over the light-emitting element may include or consist essentially of at least partially inserting the light-emitting element into one of the depressions. The mold may include or consist essentially of a plurality of discrete regions for containing phosphor, such that the cured phosphor includes or consists essentially of a plurality of phosphor chips. After removing the cured phosphor from the mold, the cured phosphor may be separated (e.g., by laser cutting, knife cutting, die cutting, and/or sawing) into a plurality of discrete phosphor chips. One or more of the phosphor chips may each be disposed over an additional light-emitting element, and, for each additional light-emitting element, the phosphor chip may absorb at least a portion of light emitted from the additional light-emitting element and may emit converted light having a different wavelength, converted light and unconverted light emitted by the additional light-emitting element combining to form substantially white light. The substantially white light may have a color temperature in the range of 2000 K to 10,000 K. The substantially white light emitted collectively from the different light-emitting elements and phosphor chips may have a variation in color temperature of less than four, or even less than two, MacAdam ellipses. The thicknesses of the phosphor chips may vary by less than ±10%, or even by less than ±5%.

The light-emitting element may be electrically connected to circuitry for powering the light-emitting element and/or to circuitry for controlling an optical output characteristic (e.g., luminous flux, correlated color temperature, color point, and/or color rendering index) of the light-emitting element and cured phosphor. A surface of the mold may be stepped, whereby after curing the cured phosphor has a plurality of portions having different thicknesses. Disposing the phosphor within the mold may include controlling an amount of phosphor introduced into the mold in response to a feedback signal. The mold may include or consist essentially of glass, metal, polyethylene terephthalate (PET), polyethylene naphthalate (PEN), plastic film, tape, adhesive on a plastic film, metal, acrylic, polycarbonate, a polymer, and/or polytetrafluoroethylene. An optical element (e.g., a lens) may be associated with the light-emitting element. The at least a portion of the cured phosphor may have a curved shape. The binder may include or consist essentially of silicone (e.g., PDMS) and/or epoxy). The light-conversion material may include or consist essentially of a plurality of phosphor particles.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 7-10 are cross-sectional schematics of light-emitting systems incorporating multiple light-emitting devices integrated with phosphors in accordance with various embodiments of the invention;

FIG. 11 is a cross-sectional schematic of a mold utilized for fabricating phosphor chips in accordance with various embodiments of the invention;

FIGS. 12A and 12B are cross-sectional schematics of phosphor chips fabricated with the mold of FIG. 11 in accordance with various embodiments of the invention;

FIG. 13 is a cross-sectional schematic of a lighting system incorporating multiple light-emitting devices integrated with the phosphor chips of FIG. 12B in accordance with various embodiments of the invention;

FIGS. 14A, 14B, 15A, and 15B are cross-sectional schematics of phosphor chips in accordance with various embodiments of the invention;

FIGS. 16A-16D are cross-sectional schematics of phosphor chips fabricated with different thicknesses from the same mold in accordance with various embodiments of the invention;

FIG. 17 is a cross-sectional schematic of an apparatus for controlling the thickness of a phosphor chip in accordance with various embodiments of the invention;

DETAILED DESCRIPTION

Figure 1:
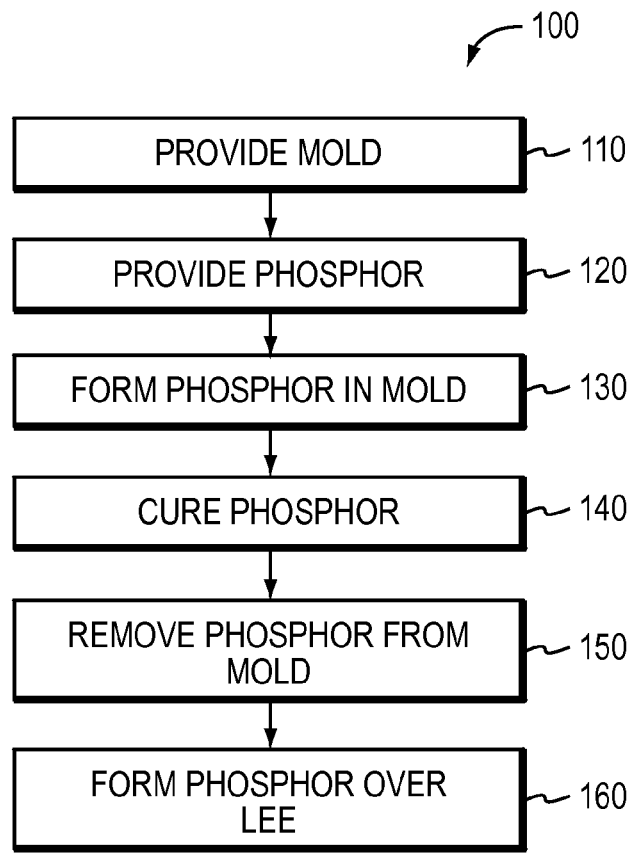
FIG. 1 is a flow chart for a process for forming phosphor-converted light-emitting devices in accordance with various embodiments of the invention.

FIG. 1 is a flow chart depicting a process 100 for forming a phosphor-converted LEE in accordance with an embodiment of the present invention. Process 100 is shown as having six steps; however, this is not a limitation of the present invention and in other embodiments the invention includes more or fewer steps and/or the steps are performed in different order. Process 100 begins with a step 110, in which a mold is provided. In a step 120, a phosphor is provided. In a step 130, the phosphor is formed in the mold. In a step 140, the phosphor is cured. In a step 150, the phosphor is removed from the mold. In a step 160, the phosphor is formed over one or more LEEs. Optionally, the phosphor may be separated into multiple pieces. This step may occur before or after step 150, removing the phosphor from the mold, and may also occur after partially curing the phosphor in step 140.

Figure 2A:
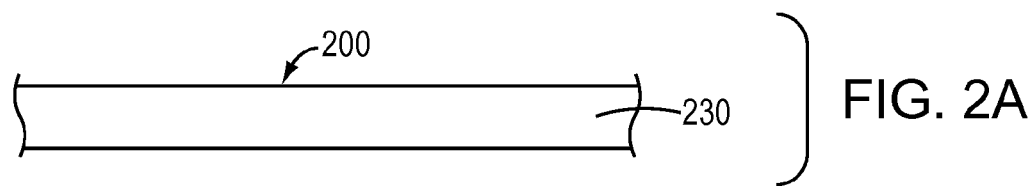
FIGS. 2A-2E are cross-sectional schematics of fabrication steps for phosphor chips in accordance with various embodiments of the invention.
Figure 2B:
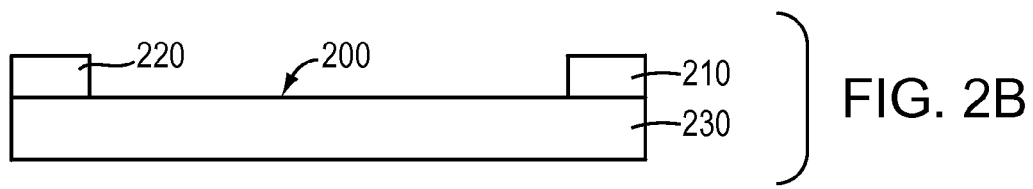
Figure 2C:
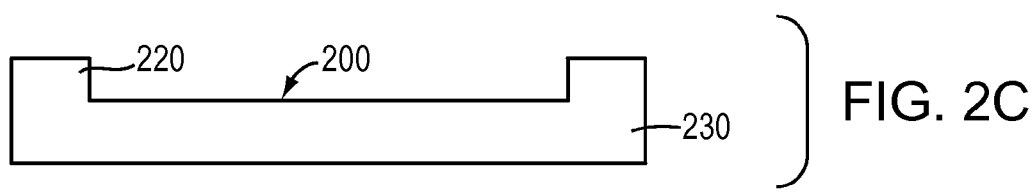

FIGS. 2A-2E depict a portion of process 100 in accordance with various embodiments of the present invention. FIG. 2A depicts a surface 200 of a mold 230. Surface 200 may incorporate one or more bounding faces 220, which may be formed by a second layer of a material 210 as shown in FIG. 2B. In one embodiment, bounding faces 220 are formed by forming a recess in mold 230, as shown in FIG. 2C. In FIGS. 2B and 2C the bounding faces 220 are shown as perpendicular or substantially perpendicular to surface 200; however, this is not a limitation of the present invention, and in other embodiments bounding faces 220 form any angle with surface 200. Mold 230 may include or consist essentially of one or more materials, for example glass, PET, PEN, plastic film, tape, adhesive on plastic film, metal, acrylic, polycarbonate, polymers, Teflon, or the like. The material of the mold is not a limitation of the present invention. In some embodiments, mold 230 is substantially rigid, while in others mold 230 is flexible. In some embodiments, it is advantageous for mold 230 to feature a "non-stick" material such as Teflon, or to have a "non-stick" coating over the surface or portion of the surface that may come in contact with a phosphor (for example the binder in the phosphor) so that the phosphor does not stick to mold 230. In some embodiments, mold 230 includes a layer of material on surface 200 and/or bounding faces 220 that does not adhere well to the binder material. In some embodiments, mold 230 includes or consists essentially of a water-soluble material, or mold 230 may be partially or completely lined with a water-soluble material to aid in the release of mold 230 from the material formed in mold 230. In one embodiment, mold 230 includes or is partially or fully lined with a water-soluble tape, for example 3M type 5414. In some embodiments, mold 230 is transparent to light, for example to visible or UV radiation. In some embodiments, the height of bounding faces 220 ranges from about 10 μm to about 1000 μm; however, the height of bounding faces 220 is not a limitation of the present invention, and in other embodiments bounding faces 220 have any height. In some embodiments, the area of mold 230 is in the range of about 0.25 mm$^2$ to about 400 cm$^2$; however, the area of mold 230 is not a limitation of the present invention, and in other embodiments the area of mold 230 is smaller or larger.

The next step in process 100 is to provide a phosphor. In one embodiment, the phosphor includes or consists essentially of a phosphor and a binder. In some embodiments the phosphor and binder are mixed, for example in a centrifugal mixer, with or without a partial vacuum over the mixture.

Figure 3A:
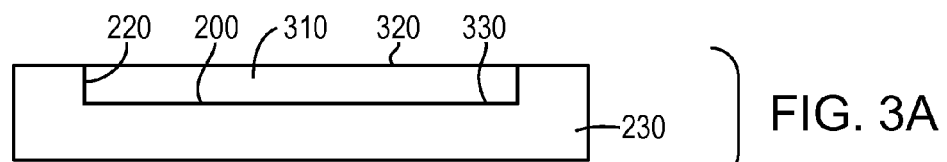
FIGS. 3A and 3B are cross-sectional schematics of a phosphor chip within and removed from a mold, respectively, in accordance with various embodiments of the invention.
Figure 3B:
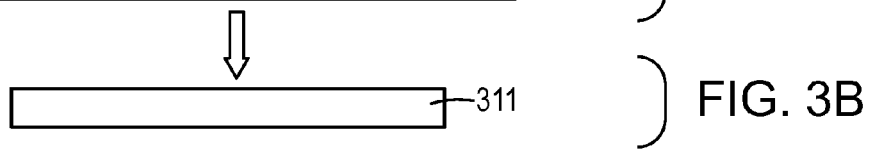

In step 130 the phosphor is formed in the mold, as shown in FIG. 3. FIG. 3 shows mold 230 from FIG. 2C having bounding faces 220 and surface 200, as well as a phosphor 310 with a top surface 320 and a bottom surface 330. Phosphor 310 may be formed in the mold by a variety of techniques, for example dispensing, pouring, injecting, etc. The method of formation of phosphor 310 in mold 230 is not a limitation of the present invention. In some embodiments, mold 230 is positioned such that surface 200 is level, such that when phosphor 310 is formed in mold 230, surface 320 and surface 330 are parallel, forming a thin layer of phosphor 310 that has a uniform or substantially uniform thickness across all or most of the area of phosphor 310. In some embodiments, mold 230 includes a flat surface, such as shown in FIG. 2A, and formation of phosphor 310 may be accomplished using a Mayer bar or draw-down bar, to achieve a uniform layer of phosphor 310. However it is formed, in one aspect of the present invention mold 230 is level or substantially level and gravity is used to automatically produce phosphor layer 310 with a uniform or substantially uniform thickness. In various embodiments of the invention, the thickness uniformity of phosphor 310 is within about ±15%, within about ±10%, within about ±5% or within about ±1%. In one embodiment, phosphor 310 has a thickness in the range of about 5 µm to about 500 µm; however, the thickness of phosphor 310 is not a limitation of the present invention and in other embodiments phosphor 310 is thinner or thicker. In one embodiment, the time between mixing a phosphor 310 including binder and phosphor powder and forming phosphor 310 in mold 230 is relatively short, compared to the time required for settling of the powder in the binder, such that the phosphor and binder form a uniform and homogeneously distributed or substantially uniform and homogeneously distributed combination of phosphor powder in the binder. In various embodiments of the invention, the compositional uniformity of phosphor 310, that is the distribution of phosphor powder in the binder, is uniform to within about ±15%, within about ±10%, within about ±5% or within about ±1%. In some embodiments utilizing mixtures of phosphor and powder, settling starts to occur within about 10 to about 30 minutes, while formation of phosphor 310 in mold 230 occurs within about 0.25 minutes to about 5 minutes.

Figure 2D:
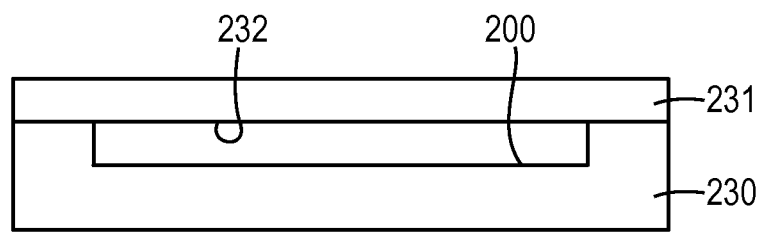

In some embodiments, a mold top or mold cover 231 (as shown in FIG. 2D) may be formed over mold 230. Mold top 231 may be formed over mold 230 before or after formation of phosphor 310. In some embodiments, a surface 232 of mold top 231 is parallel or substantially parallel to surface 200 of mold 230, such that after curing, a phosphor 311 (shown in FIG. 3) has a substantially uniform thickness substantially controlled by the distance between surfaces 200 and 232. In some embodiments, mold 230 is filled or overfilled with phosphor 310, such that when using mold top 231 there is an amount of phosphor 310 that is in excess of the amount required to fill the mold cavity defined by mold 230 and mold top 231. In some embodiments, excess phosphor 310 is squeezed out between mold top 231 and mold 230, as shown in FIG. 2E.

Figure 2E:
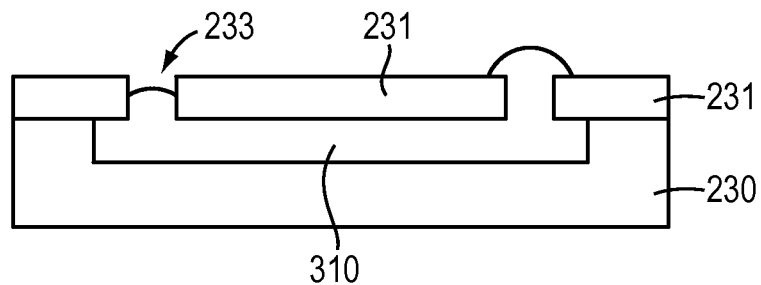

In some embodiments of this example, one or more portions of mold 230 and/or mold top 231 have one or more openings or through-holes 233 that provide an overflow pathway for phosphor 310 during the mating process, as shown in FIG. 2E. When mold 230 and mold top 231 are mated, hole 233 provides a pathway for excess phosphor 310 to escape, thereby permitting the manufacture of a uniform phosphor plate 311, without excess phosphor squeezing out from the sides of the mold. In some embodiments, this provides improved control of the thickness of phosphor 311 as well as a more reproducible manufacturing process. This approach may be applied to other embodiments, for example where the mold top 231 is formed prior to formation of phosphor 310 in the mold.

In step 140, phosphor 310 is cured. Curing may include or consist essentially of heating, exposure to radiation of various sources, for example visible, UV and/or IR light, or chemical curing (i.e., addition of an additional agent that promotes cross-linking in the binder). In one embodiment, phosphor 310 is cured by UV or other radiation and mold 230 is transparent to such radiation. In one embodiment, mold 230 is held within the curing equipment prior to or just after step 130 of FIG. 1. In some embodiments utilizing mixtures of phosphor and powder, settling starts to occur within about 10 to about 30 minutes, while curing of phosphor 310 in mold 230 occurs within about 0.10 minutes to about 5 minutes. In various embodiments of the invention, steps 130 and 140 collectively consume less than about 10 minutes, less than about 5 minutes, or less than about 1 minute. In some embodiments, the curing step 140 includes or consists essentially of multiple sub-curing steps. For example, a first sub-curing step may be performed to "freeze" the phosphor particles in the matrix, and this may be followed by a second sub-curing step to fully cure the binder.

In step 150 the cured phosphor 310, now identified as phosphor 311, is removed from mold 230. At this point in the process, phosphor 311 is a solid having parallel or substantially parallel face 320 and face 330, where the thickness bounded by face 320 and face 330 is uniform or substantially uniform. In one embodiment, the thickness uniformity of phosphor 311 is within about ±15%, within about ±10%, within about ±5% or within about ±1%. In one embodiment, phosphor 311 has a thickness in the range of about 5 µm to about 500 µm; however, the thickness of phosphor 311 is not a limitation of the present invention, and in other embodiments phosphor 311 is thinner or thicker. In one embodiment, the compositional uniformity of phosphor 311, i.e., the distribution of phosphor powder in the binder, is uniform to within about ±15%, within about ±10%, within about ±5% or within about ±1%. In some embodiments, the area of phosphor 311 is in the range of about 0.25 mm$^2$ to about 400 cm$^2$; however, the area of phosphor 311 is not a limitation of the present invention, and in other embodiments the area of phosphor 311 is smaller or larger.

Figure 4:
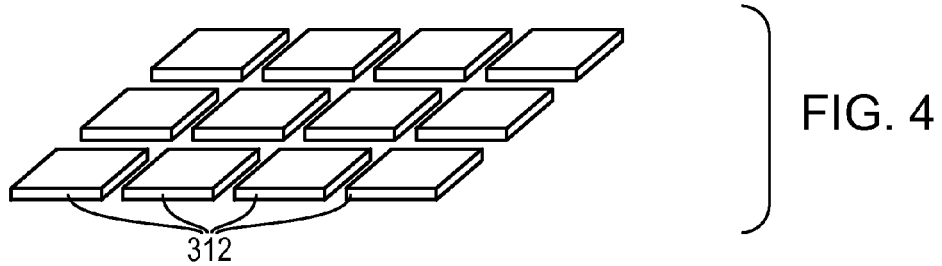
FIG. 4 is a schematic depiction of multiple phosphor chips fabricated in accordance with various embodiments of the invention.

In some embodiments, phosphor 311 is separated into multiple pieces prior to use. Separation of phosphor 311 may be performed via any of multiple techniques, for example laser cutting, cutting with a knife, die cutting, saw cutting, or the like. In some embodiments, separation of phosphor 311 into multiple pieces is done before step 150 (removal of phosphor from mold) while in other embodiments separation of phosphor 311 into multiple pieces is done after step 150. FIG. 4 shows a schematic of phosphor 311 separated into multiple pieces 312. Phosphor pieces 312 are shown in FIG. 4 as being square and having sidewalls perpendicular to surface 320. However, this is not a limitation of the present invention, and in other embodiments phosphor pieces 312 are rectangular, hexagonal, circular, triangular or any arbitrary shape, and/or have sidewalls forming any angle with respect to the surface 320 of phosphor piece 312.

Figure 5A:
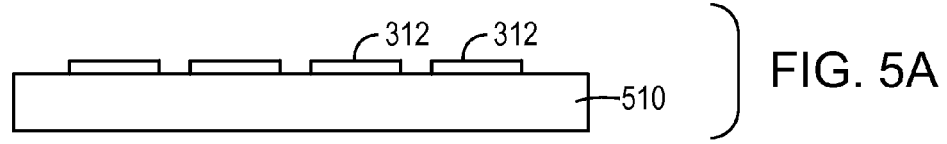
FIG. 5A is a cross-sectional schematic of phosphor chips transferred to an adhesive film in accordance with various embodiments of the invention.

In some embodiments, phosphor 311 is transferred from mold 230 to a flexible and optionally adhesive film 510, as shown in FIG. 5A. Such a transfer may be performed, for example, by peeling phosphor 311 off of mold 230 and placing it on film 510. In one embodiment, film 510 includes or consists essentially of a thermal release adhesive, while in another embodiment film 510 includes or consists essentially of a UV release adhesive. In some embodiments, film 510 is the same as or similar to dicing or transfer tapes used in the semiconductor industry for singulation and/or transfer of dies, e.g., Revalpha from Nitto Denko Corporation or tapes from Semiconductor Equipment Corporation. In some embodiments, mold 230 includes or consists essentially of film 510, that is, the phosphor is formed directly on film 510 instead of being formed in mold 230 and transferred to film 510. In one embodiment, film 510 includes or consists essentially of a water-soluble tape, for example 3M type 5414.

In some embodiments, mold 230 includes multiple depressions or wells into which phosphor 310 is formed, permitting formation of structures such as that shown in FIG. 4 (i.e., multiple separate sections), without the necessity of cutting cured phosphor 311 into pieces 312. In some embodiments, a cover or plate is formed over mold 230 after provision of phosphor 310 over mold 230. In some embodiments, the cover or plate acts to form a smooth top surface 320 and to help produce a uniform thickness of phosphor 311.

The process detailed above generally produces uniform or substantially uniform phosphor pieces or chips 312. These may then be applied to LEEs, for example to achieve white light emission from the combination of the LEE and the phosphor chip; at least a portion of the light emitted by the LEE is absorbed by phosphor chip 312, and at least a portion of the absorbed light is re-emitted at a different wavelength. In one embodiment, white light is formed from a structure including or consisting essentially of a LEE emitting in the blue wavelength range (about 440 μm to about 470 μm), for example a blue LED and one or more phosphors emitting in the yellow-red range, such that the combination produces light that appears white to the eye. In one embodiment, the white light is visible light with a spectral power distribution whose chromaticity is close to the blackbody locus in the CIE 1931 xy or similar color space. In one embodiment, white light may have a correlated color temperature (CCT or color temperature) in the range of about 2000K to about 10,000K. Embodiments of the invention are not limited to materials, processes and structures that produce white light; in other embodiments these materials, structures and processes are used to produce any color light.

Figure 5B:
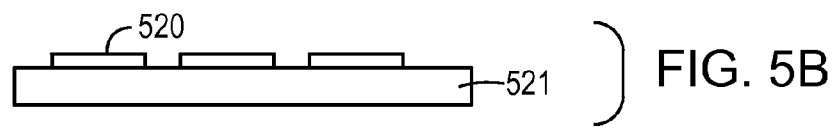
FIG. 5B is a cross-sectional schematic of light-emitting elements on a substrate in accordance with various embodiments of the invention.
Figure 5C:
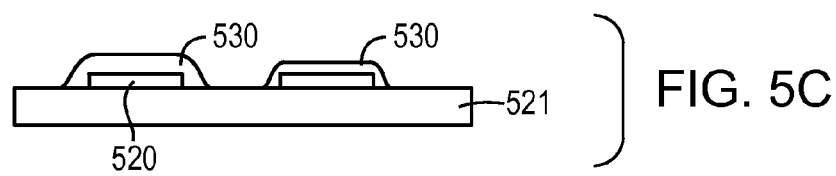
FIG. 5C is a cross-sectional schematic of an attachment agent applied to the light-emitting elements of FIG. 5B in accordance with various embodiments of the invention.
Figure 5D:
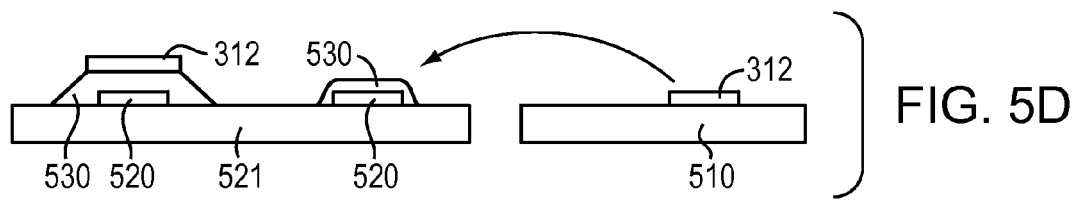
FIG. 5D is a cross-sectional schematic of the application of phosphor chips to the light-emitting elements and attachment agents of FIG. 5C in accordance with various embodiments of the invention.

Application of phosphor chip 312 to the LEE may be performed in any of a variety of ways and with any of a number of attachment agents (such as clips, frames, or adhesion agents). In one embodiment phosphor chips 312 are picked from the structure shown in FIG. 5A and placed on the LEEs using a conventional pick-and-place tool. In one embodiment the process starts with an LEE 520 on a substrate 521 as shown in FIG. 5B. An adhesive agent 530 is then formed over LEE 520, as shown in FIG. 5C. As may be seen from FIG. 5C, different amounts of adhesive agent may be applied for different needs. For example if phosphor chip 312 is significantly larger than LEE 520 and is designed to overlap LEE 520, as shown in the example on the left of FIG. 5D, then a larger amount of adhesive agent may be advantageous compared to the amount used for a smaller phosphor chip, as shown on the right of FIG. 5D. Phosphor chips 312 may be transferred from the structure shown in FIG. 5A to that shown in FIG. 5D using a variety of means. In one embodiment phosphor chips 312 may be treated similarly to semiconductor chips and transferred using commonly available semiconductor chip or package transfer tools, such as pick and place tools. FIG. 5D shows transfer of phosphor chips 312 from the chip substrate 521 to the LEE. While FIGS. 5C and 5D depict the adhesive agent as applied to all exposed surfaces of the LEEs 520, in some embodiments the adhesive agent is applied only to a portion or the entirety of the top surface of an LEE 520. In some embodiments, the adhesive agent may include or consist essentially of a transfer tape such as, e.g., 467, 7995, or 7962 tapes available from 3M. In preferred embodiments, the transmittance of the attachment agent (particularly if the attachment agent is an adhesive agent) for a wavelength emitted by the LEE 520 is greater than 90%, or even greater than 95%.

In one embodiment phosphor chip 312 is applied to the LEE using an adhesion agent that is distinct from phosphor chip 312 and/or from the LEE. In one embodiment an adhesive or glue is disposed between the LEE and phosphor chip 312. In various embodiments this may be done using a liquid adhesive which may be sprayed, dispensed, screen printed, or stencil printed onto the LEE prior to application of phosphor chip 312. In one embodiment an adhesion agent may be applied to one side of phosphor chip 312 and that side applied to the LEE. Application of the adhesion agent to phosphor chip 312 may be done in ways similar to application of the adhesion agent to the LEE, as described herein. In other embodiments the adhesion agent may be applied to the cured phosphor before singulation into discrete chips.

In some embodiments the adhesion agent may include a curable adhesion agent, where the curing is activated by exposure to air, radiation, for example heat, UV radiation or the like, or moisture or by other means. In some embodiments the adhesion agent may have more than one component. For example in one embodiment a two-component adhesion agent may be utilized by application of a first part to phosphor chip 312 and a second part to the LEE, where the agent becomes adhesive when the two parts are brought in contact. In some embodiments such an approach may require additional activation for curing, while in others that is not required. Advantageously, a two-component system may be used in one embodiment by application of a first component to the phosphor before singulation into chips. In a similarly advantageous fashion, radiation or otherwise activated adhesives may be applied to the phosphor before singulation.

Adhesion agents preferably have high transparency to all or a significant portion of the wavelengths and/or radiant flux emitted by the LEE. In some embodiments the adhesion agent may be the same or similar material that is used as the binder or matrix for the phosphor chip.

Figure 5E:
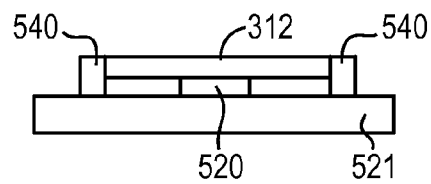
FIGS. 5E and 5F are cross-sectional schematics of mechanical attachment agents attaching phosphor chips to light-emitting elements in accordance with various embodiments of the invention.
Figure 5F:
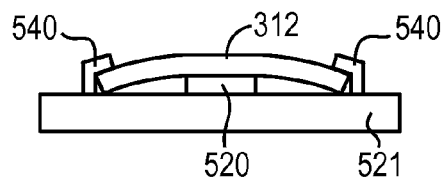

In some embodiments of the present invention phosphor chip 312 may be held in place mechanically, for example by fitting into a frame or clip on the substrate surrounding the LEE, as shown in the examples in FIGS. 5E and 5F. FIGS. 5E and 5F depict a mechanical attachment agent 540 (in the form of a frame in FIG. 5E and a clip in FIG. 5F) attaching the phosphor chip 312 to the underlying LEE 520. The examples shown in FIGS. 5E and 5F are exemplary and are not meant to be limitations of the present invention.

In some embodiments of the present invention a transparent transfer tape may be applied to the phosphor before singulation into chips. In some embodiments a liner covers the side of the transfer tape opposite the phosphor. In some embodiments the phosphor and transfer tape are singulated in one step, while in other embodiments this is a multi-step process. Singulation may be accomplished in some embodiments using means described herein for phosphor singulation, for example laser cutting, knife cutting, shearing, rotary wheel cutting or the like. The method of singulation is not a limitation of the present invention. In embodiments where a liner is present, the liner is removed and the phosphor chip adhered to the LEE. Transfer tapes preferably have high transparency to all or a significant portion of the wavelengths and/or radiant flux emitted by the LEE.

In some embodiments high transparency means a transmissivity greater than 90% for all of the radiant flux incident on it from the LEE. In some embodiments high transparency means a transmissivity greater than 95% for all of the radiant flux incident on it from the LEE. In some embodiments high transparency means a transmissivity of greater than 90% for wavelengths in the range of about 420 nm to about 700 nm. In some embodiments high transparency means a transmissivity of greater than 95% for wavelengths in the range of about 420 nm to about 700 nm.

Figure 6:
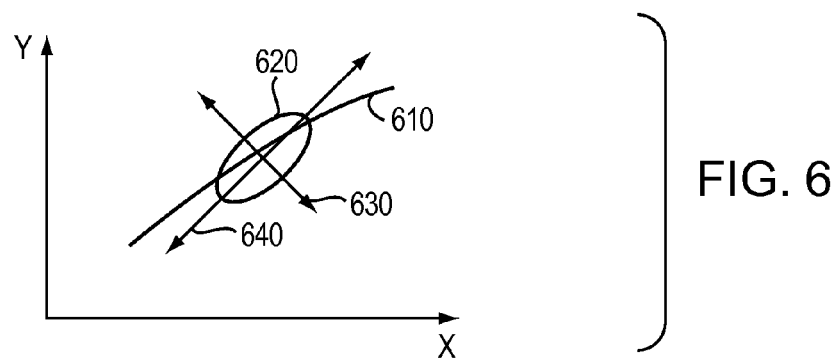
FIG. 6 is a schematic CIE chromaticity diagram.

Advantageously, embodiments of the present invention produce phosphor chips 312 that have uniform or substantially uniform thickness and uniform or substantially uniform distribution of phosphor particles in the binder. The thickness and distribution, or loading, of the phosphor particles may have a strong impact on the uniformity of the color temperature of the light. In systems with multiple LEEs, and in particular arrays with tens to thousands of LEEs, it may be otherwise difficult to achieve a uniform phosphor coating over all of the LEEs, resulting in non-uniform color temperature. FIG. 6 shows a schematic of the CIE chromaticity diagram with the blackbody locus 610 and an ellipse 620 representing one or more MacAdam ellipses. The major axis of MacAdam ellipse 620 is labeled as 640 while the minor axis is labeled as 630. A MacAdam ellipse represents a region of colors on the chromaticity chart and a one-step MacAdam ellipse represents the range of colors around the center of the ellipse that are generally indistinguishable to the average human eye, from the color at the center of the ellipse. The contour of a one-step MacAdam ellipse therefore represents the just noticeable differences of chromaticity.

Multiple-step MacAdam ellipses that encompass larger ranges of color around the center point may be constructed. The black body locus is in general aligned with the major axis of a MacAdam ellipse, meaning that the eye is less sensitive to color differences along the black body line, which equates to red/blue shifts, than to differences perpendicular to the black body line, which equates to a green/magenta shift. Furthermore, with respect to phosphor-converted white light sources, the variation in the minor axis direction 630 is in large measure determined by the LEE (typically a LED) wavelength variation, while the variation in the major axis direction 640 may be determined by the phosphor concentration and thickness. While there are many recommendations as to how tight the color temperature uniformity should be (as measured by MacAdam ellipses), it is clear that a variation encompassed within a smaller step number of MacAdam ellipses (smaller ellipse) is generally more uniform than one encompassed within a larger step number of MacAdam ellipses (larger ellipse). For example, a four-step MacAdam ellipse encompasses about a 300K color temperature variation along the black body locus, centered at 3200K, while a two-step MacAdam ellipse encompasses about a 150K color temperature variation along the black body locus, centered at 3200K.

The importance of uniform thickness and phosphor concentration in phosphor chips 312 may be observed in relation to the MacAdam ellipse on the chromaticity chart of FIG. 6. Since the major axis length is largely determined by the phosphor concentration and thickness, variations in these parameters result in an increase in the major axis of the MacAdam ellipse and thus an increase in the variation in color temperature. The aforementioned technique for fabrication of uniform phosphor chips 312, when used in a phosphor-converted light source, typically results in a reduction in the variation in color temperature and thus a more uniform color temperature light source, both within a lighting system featuring an array of phosphor-converted LEEs and between such lighting systems. The use of the aforementioned LEEs in lighting systems typically permits the manufacture of large numbers of lighting systems having uniform color temperatures.

Figure 7:
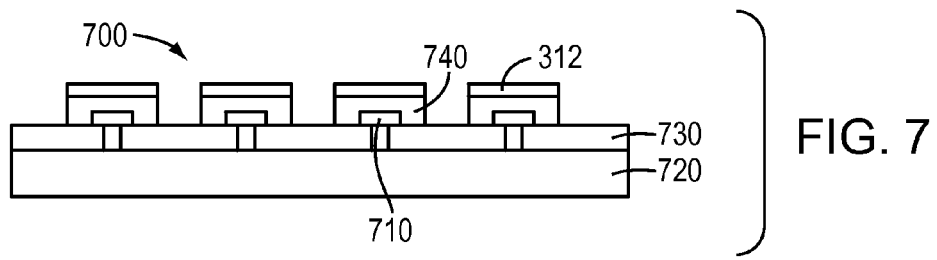

FIG. 7 depicts one embodiment of such a lighting system 700, which includes multiple LEEs 710 formed over an LEE substrate 720. The LEEs 710 are electrically coupled together by conductive traces 730 formed over substrate 720. System 700 optionally includes transparent material 740 formed between all or some phosphor chips 312 and LEEs 710. In one embodiment, transparent material 740 includes or consists essentially of the binder or matrix material described previously (and substantially lacks phosphor particles), and acts to provide improved optical coupling between LEEs 710 and phosphor chips 312, as well as to increase light extraction from LEEs 710 by reducing total internal reflection (TIR) losses in LEEs 710.

LEE substrate 720 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. LEE substrate 720 may also include or consist essentially of a rigid or flexible circuit board, for example FR4, metal core printed circuit board (MCPCB), polyimide or the like. LEE substrate 720 may be substantially flexible, substantially rigid or substantially yielding. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

LEE substrate 720 may include multiple layers, e.g., a deformable layer over a rigid layer, for example, a semicrystalline or amorphous material, e.g., PEN, PET, polycarbonate, polyethersulfone, polyester, polyimide, polyethylene, paint, plastic film and/or paper formed over a rigid substrate for example including, acrylic, aluminum, steel and the like. Depending upon the desired application for which embodiments of the invention are utilized, LEE substrate 720 is substantially optically transparent, translucent, or opaque. For example, LEE substrate 720 may exhibit a transmittance or a reflectivity greater than about 80% for optical wavelengths ranging between approximately 400 nm and approximately 700 nm. In some embodiments, LEE substrate 720 exhibits a transmittance or a reflectivity of greater than about 80% for one or more wavelengths emitted by LEE 710 and/or phosphor chip 312. LEE substrate 720 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

Conductive traces 730 may include or consist essentially of any conductive material, for example metals such as gold, silver, aluminum, copper and the like, conductive oxides, carbon, etc. Conductive traces 730 may be formed on LEE substrate 720 by a variety of means, for example physical deposition, plating, lamination, lamination and patterning, electroplating, printing or the like. In one embodiment, conductive traces 730 are formed using printing, for example screen printing, stencil printing, flexo, gravure, ink jet, or the like. Conductive traces 730 may include or consist essentially of a transparent conductor, for example, a transparent conductive oxide such as indium tin oxide (ITO). Conductive traces 730 may include or consist essentially of one or more materials. Conductive traces 730 may optionally feature stud bumps to aid in electrical coupling of conductive traces 730 to LEEs 710. Conductive traces 730 may have a thickness in the range of about 0.05 µm to about 250 µm. While the thickness of one or more of the conductive traces 730 may vary, the thickness is generally substantially uniform along the length of the conductive trace 730 to simplify processing. However, this is not a limitation of the present invention and in other embodiments the conductive trace thickness or material varies.

In one embodiment, one or more LEEs 710 are electrically coupled to conductive traces 730 using conductive adhesive, e.g., an isotropically conductive adhesive and/or an anisotropically conductive adhesive (ACA), as described in U.S. patent application Ser. No. 13/171,973, filed Jun. 29, 2011, the entire disclosure of which is incorporated by reference herein. An ACA is a material that permits electrical conduction only in the vertical direction but insulates the conductive trace 730 from each other. As used here, ACA may be provided in any form, for example paste, gel, liquid, film, or otherwise. ACAs may be utilized with or without stud bumps in accordance with embodiments of the present invention.

Various embodiments may utilize one or more other electrically conductive adhesives, e.g., isotropically conductive adhesives, in addition to or instead of one or more ACAs. Various embodiments may utilize wire bonding, thermosonic bonding, ultrasonic bonding, or solder as the method to connect LEEs 710 to conductive traces 730. The method of attachment and/or electrical coupling of LEE 710 to conductive traces 730 are not a limitation of the present invention.

A further advantage of the aforementioned approach is that it is has a relatively high efficiency of use of the phosphor, which may be relatively expensive. In large arrays of LEEs, the LEE pitch (distance between LEEs) may be on the order of about 3 mm to about 20 mm. In some embodiments, a large array has an area in the range of about 100 cm$^2$ to about 3600 cm$^2$ or to about 10,000 cm$^2$ or larger. If the entire area were to be covered by phosphor, this would require a very large amount of phosphor, most of which would not be optically active. As an example, assume an array size of about 2500 cm$^2$ and a pitch of about 5 mm; this results in an array of 100×100 LEEs, for a total of 10,000 LEEs. If each LEE is associated with a phosphor chip having a size of about 1.5 mm×about 1.5 mm, this results in a phosphor area for the present invention of about 225 cm$^2$ (excluding kerf loss). This is about a 10× reduction in the area of phosphor required for such an array. As the LEE pitch increases, the area reduction increases.

The structure shown in FIG. 7 may be manufactured by a variety of techniques. In one embodiment, after placement of LEEs 710, a portion of transparent material or binder 740 is dispensed over all of or a portion of an LEE 710. Phosphor chip 312 is then placed over transparent material 740 and transparent material 740 is cured, for example using heat or UV radiation. In one embodiment, phosphor chip 312 is placed over transparent material 740 using a conventional pick-and-place tool, by picking the phosphor chip from the structure shown in FIG. 5A. In some embodiments, film or tape 510 includes or consists essentially of a heat- or UV-release tape, such that the tackiness level of the adhesive is greatly reduced upon heating or exposure to UV radiation. Such a reduction in tackiness leads to easier removal (picking) from film 510 during the pick-and-place operation. In some embodiments, picking may be aided by the use of an ejector pin that pushes up from underneath film 510, to help remove phosphor chip 312 from film 510. In another embodiment, a portion of transparent material or binder 740 is dispensed over all or a portion of phosphor chip 312 prior to placement over LEE 710.

In the embodiment shown in FIG. 7, phosphor chip 312 is physically and/or thermally separated from LEE 710, resulting in a "remote phosphor" configuration. Such a configuration may result in less heating of phosphor chip 312 during operation, leading to increased efficiency and longer life. In some embodiments, material 740 is not utilized and the phosphor chip 312 is not spaced away from the LEE 710.

In the embodiment shown in FIG. 7, phosphor chip 312 extends beyond the edge of LEE 710. The degree of the overhang may be adjusted to achieve full or the desired level of coverage of the blue emission by phosphor chip 312, in order to minimize or eliminate direct emission from LEE 710. As shown in FIG. 8, in another embodiment phosphor chip 312 completely covers the top and sides of LEE 710. In another embodiment, LEE 710 is thin enough (identified as LEE 910 in FIG. 9) such that full coverage of LEE 710 by phosphor chip 312 may be accomplished with an essentially flat phosphor chip 312, as shown in FIG. 9. The structure in FIG. 9 may or may not include transparent material 740. Thin LEE 910 may be formed by removing all or a portion of the growth substrate, for example by removing the sapphire or silicon carbide substrate upon which GaN-based LEEs are typically grown. In some embodiments the sapphire or SiC substrate is removed by laser lift-off (LLO) or mechanical or chemical mechanical polishing (CMP). In another embodiment, LEE 910 is grown on a silicon substrate and the silicon substrate removed by wet chemical etching, dry chemical etching, lapping, polishing, CMP, undercut etching, any combinations of these or the like. In some embodiments, LEEs 710 and/or 910 have a reflective coating over all or a portion of the surface adjacent to substrate 720 and conductive traces 730. The reflective coating may be reflective to a wavelength of light emitted by LEE 710 and/or 910 and/or phosphor chip 312.

In some embodiments, LEEs 710 and/or 910 may be formed in an indentation or well 1010 such that all or a portion of an LEE 710 and/or LEE 910 is within well 1010, as shown in FIG. 10. Well 1010 may be fully or partially filled with transparent binder 740. Well 1010 may be formed as part of LEE substrate 720, or may be formed by the addition of one or more layers 1020, having through-holes that correspond to the position of LEE 710. Phosphor chip 312 may overhang well 1010 as shown in FIG. 10, or may fit inside well 1010.

In the examples above, the phosphor chip 312 is generally shown as a uniform rectangular solid having substantially smooth surfaces; however, this is not a limitation of the present invention, and in other embodiments phosphor chip 312 is shaped in any manner and/or may have roughened, patterned or textured surfaces, with such surface features in a regular, periodic or random pattern. In some embodiments, shaping and/or patterning or texturing of the surface is achieved during the formation or molding process, while in other embodiments shaping and/or patterning or texturing are performed after the phosphor is molded or after it is cured or partially cured.

In another embodiment, one or more surfaces of phosphor chip 311 are non-smooth, for example roughed, textured or patterned. In one embodiment, the non-smooth surface reduces total internal reflection (TIR) within phosphor chip 311 and achieves improved light extraction. In another embodiment, phosphor chip 311 is shaped in a lens shape. Such a lens may be a hemisphere, a paraboloid, a Fresnel optic or any other shape. In one embodiment, such a lens may be used to achieve a specific and desired light-distribution pattern. In one embodiment, phosphor chip 311 includes a photonic crystal formed on all or a part of the surface of phosphor chip 311, for example on all or a portion of the top surface of phosphor chip 311. In one embodiment, the photonic crystal increases the intensity of light exiting phosphor chip 311 in a particular direction.

In one embodiment, mold 230 features raised regions or bumps 1110 having substantially the size of LEE 710 or larger, as shown in FIG. 11. Such a mold produces phosphor 311 with indentations or wells 1210. After separation, phosphor chips 312 having indentations 1210 may be formed, as shown in FIGS. 12A and 12B. Phosphor chips 312 with indentations 1210 may now be placed over LEEs 710 as shown in FIG. 13 (conductive traces 730 not shown for clarity). Indentations 1210 may fit relatively snugly over LEE 710 or may be large enough to leave space between phosphor chip 312 and LEE 710. Transparent material 740 may optionally be formed between phosphor chip 312 and LEE 710 (not shown in FIG. 13). In some other embodiments of this aspect of the invention, mold 230 features multiple depressions into which phosphor 310 may be formed. The region of mold 230 between the depressions corresponds to the eventual position of LEE 710, and after curing and separation phosphor chips 312 with depressions 1210, similar to those shown in FIG. 12 are formed. In some embodiments, such a process forms phosphor chips 312 similar to those shown in FIG. 12 but having a portion of phosphor 311 overhanging the regions formed by the depressions in mold 230, forming a shape similar to the Greek letter pi.

In another embodiment, phosphor 310 and 311 and phosphor chip 312 include or consists essentially of multiple discrete layers. In one embodiment, a first layer 1420 includes or consists essentially of a transparent material such as binder or matrix material 740 and a second layer 1410 includes or consists essentially of a phosphor layer or phosphor-containing layer, as shown in FIGS. 14A and 14B. FIGS. 15A and 15B illustrate other embodiments featuring a first layer 1420 that includes or consists essentially of a transparent material such as binder or matrix material 740, a second layer 1410 that includes or consists essentially of a first phosphor layer or phosphor-containing layer, and a third layer 1430 that includes or consists essentially of a second phosphor layer or phosphor-containing layer. The first phosphor layer or phosphor-containing layer is different from (i.e., includes or consists essentially of a different phosphor material or a different concentration of the same phosphor material) the second phosphor layer or phosphor-containing layer.

In the above discussion, mold surface 200 (FIG. 3) is shown as flat; however, this is not a limitation of the present invention, and in other embodiments mold surface 200 is concave, is convex, or has any arbitrary shape. In one embodiment, mold surface 200 is tilted or stepped to make phosphor chips 312 with different thicknesses. An example is shown in FIGS. 16A-16D, which depict a mold 230 having three different regions 1, 2 and 3, each having a different depth. In one embodiment, the phosphor chip 311 is separated from the mold 230, and then phosphor chips $312_1$, $312_2$ and $312_3$ are separated from the different thickness phosphor layers. The different-thickness phosphor chips 312 may be associated with LEEs 710 with different peak emission wavelengths and use LEEs 710 with a relatively wide emission wavelength range. In another embodiment, the bottom surface 200 of mold 230 is slanted to provide a variation in thickness of phosphor chips 312. In another embodiment, mold 230 is tilted to provide a variation in the thickness of phosphor chips 312.

In one embodiment, the thickness of phosphor 310, and thus the thickness of phosphor chip 312, is controlled by feedback during the filling process of mold 230. In one embodiment, phosphor 310 is excited by an appropriate pump source, for example a LEE such as a LED or laser, and the resulting white-light color temperature measured. When the target white-light color temperature is reached, the fill mechanism is notified to stop the filling of mold 230. FIG. 17 depicts an example of such an embodiment, with mold 230, a reservoir 1740 of phosphor 310, phosphor 310 also in mold 230, a pump source 1710, and a detector 1720. The target color temperature is compared to that measured by detector 1720, and when the target color temperature is reached, detector 1720 sends a signal to close valve 1730, stopping further dispensing of phosphor 310 into mold 230. In some embodiments, detector 1720 and valve 1730 operate in an on-off configuration while in other embodiments they use a proportional control. In some embodiments, an offset in the timing or valve-control signal is included to accommodate hysteresis or delays in the mold-filling process. Mold 230 may be transparent or have a transparent region or window to a wavelength of light emitted by pump source 1710. FIG. 17 shows one configuration of such a filling control scheme; however, other configurations may be employed, and the specific configuration is not a limitation of the present invention. In another embodiment, pump source 1710 may be above mold 230, rather than below it. After phosphor 310 is deposited or dispensed, it may be cured and the resulting structure processed as described elsewhere in this description.

The approach described above provides various apparatus and methods to make uniform phosphor chips 312, resulting in highly uniform optical characteristics of phosphor chips 312 and LEEs 710. However, the uniformity of the optical characteristics may also depend on the optical characteristics of the LEE 710, in particular its emission wavelength. Referring back to FIG. 6, even if the phosphor is perfectly uniform, a variation in LEE 710 emission wavelength may result in an increased distribution in color temperature and/or other optical characteristics. One approach is to test and sort, or bin, LEEs 710 to create groups of LEEs 710 with relatively narrow distributions of optical characteristics, for example emission wavelength, and to then create different thickness or composition phosphor chips 312 to match the average optical characteristics of the group of LEEs 710.

Figure 18:
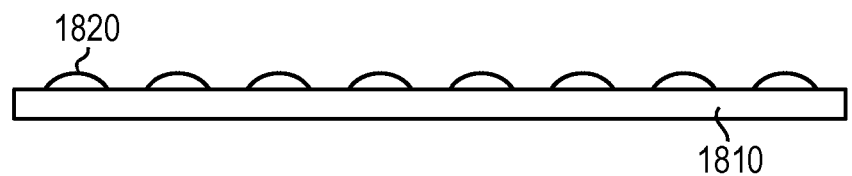
FIG. 18 is a cross-sectional schematic of a phosphor chip having multiple regions of different phosphors in accordance with various embodiments of the invention.

In another embodiment, a first layer of phosphor 310 is formed and is cured, uncured or partially cured, and then a second layer of phosphor 310 is formed over one or more portions of the initial phosphor that was formed, in response to a need for varying thickness phosphor chips 312. A schematic of such a structure is shown in FIG. 18, which depicts a first phosphor 1810 and a second phosphor 1820 thereover. In one embodiment, this approach permits improvement of the uniformity of the total phosphor thickness, or reduces the uniformity requirement of first phosphor layer 1810. Additionally, this provides a way to provide an engineered non-uniform phosphor chip, such as a non-uniform phosphor chip 312.

In another embodiment, a set of dividing grids is formed in mold 230 prior to formation of phosphor 310. The grids divide phosphor 310 into smaller regions, which after curing form phosphor chips 312. This is an alternate approach to cutting or separation of the phosphor after curing.

The arrangement of phosphor chips 312 makes them amenable to transfer or pick-and-place operations of multiple units at a time. The techniques described here permit the formation of relatively large rectangular or square arrays, from which a multiple tool pick-and-place or stamp operation may be fed with almost 100% utilization of all phosphor chips 312 in the array, where the pick or stamp pitch is, in some embodiments, an integer multiple of the pitch of phosphor chips 312 in the source array.

In some embodiments, the approaches described above to make multiple phosphor chips 312 are combined with testing and sorting to produce bins or groups of phosphor chips 312 having relatively narrowly distributed characteristics. For phosphor chips such properties may be determined alone or in combination with one or more LEEs 710. Such characteristics may include electrical characteristics such as forward voltage, leakage current, etc., and/or optical characteristics such as color temperature, color rendering index, efficiency, light output power and the like.

The approaches described above may permit batch or bulk fabrication of relatively large numbers of phosphor chips 312 in an economical manner with relatively tight distributions of characteristics. In particular, these approaches lead to the manufacture of cost-effective phosphor chips 312, that when combined with LEEs 710, have relatively narrow color temperature variations. In some embodiments, these approaches lead to a plurality of combinations of phosphor chips 312 and LEE 710 having a color temperature range of less than about five MacAdam ellipses, or less than three MacAdam ellipses, or less than two MacAdam ellipses or even less than one MacAdam ellipse.

The methods described above may permit the manufacture of very large arrays of phosphor chips 312 in an economical manner with a relatively narrow distribution in optical and mechanical characteristics. In some embodiments, the phosphor chip 312 has a side dimension of about 250 µm to about 5 mm and the kerf is about 10 µm to about 50 µm. In one embodiment, phosphor chips 312 have a pitch of about 1000 µm. This leads to a density of phosphor chips of about 1.0/mm² or about 100 phosphor chips 312 per square cm. The manufacturing approaches described above may be practiced on any arbitrary size area. In one embodiment the area is about 10 cm×about 10 cm, or about 1000 cm². In this example, this leads to the ability to manufacture 100,000 phosphor chips 312 simultaneously. This is just one example and not meant to be limiting to the invention. In general the density of phosphor chips 312 may vary with the size of LEEs 710 to which they are associated, the kerf, and the amount of phosphor desired on the sides of LEEs 710.

The above-described equipment, structures and methods may permit an integrated approach to the manufacture of phosphor chips 312 in a batch process at relatively low cost. This approach may include testing and sorting and binning, as is done with conventional packaged white LEDs. Trimming may be employed to further narrow the distribution of phosphor chip characteristics. In contrast to conventional packaged white LEDs, this approach may produce phosphor chips 312 that are then combined with LEEs 710. This reduces the cost and complexity of using white LEDs. A further advantage of embodiments of the invention is the use of a relatively larger portion of the manufacturing output of LEEs 710, because it provides an economical and straightforward way to match the phosphor characteristics to those of LEEs 710, in order to produce useful distributions of white light emitters.

In the structures described above, one or more surfaces of the phosphor, for example phosphor 311 or phosphor chips 312, may be patterned or roughened to improve light extraction from the phosphor, for example by reducing TIR in the phosphor. Such patterns or roughened or textured surfaces may be formed in a variety of ways. In one embodiment, these are formed by molding. In one embodiment, these are formed by techniques such as, for example laser ablation, wet or dry chemical etching, grinding, drilling or the like. In one embodiment, these may be formed by selective curing of the phosphor 310. In one embodiment, these features may be an array, such as a regular periodic array like a photonic crystal to aid in controlling the direction of the light exiting the phosphor. In some embodiments, such texturing, patterning or the like is present only on one surface, on one portion of one surface, or on multiple surfaces of the phosphor.

Figure 19:
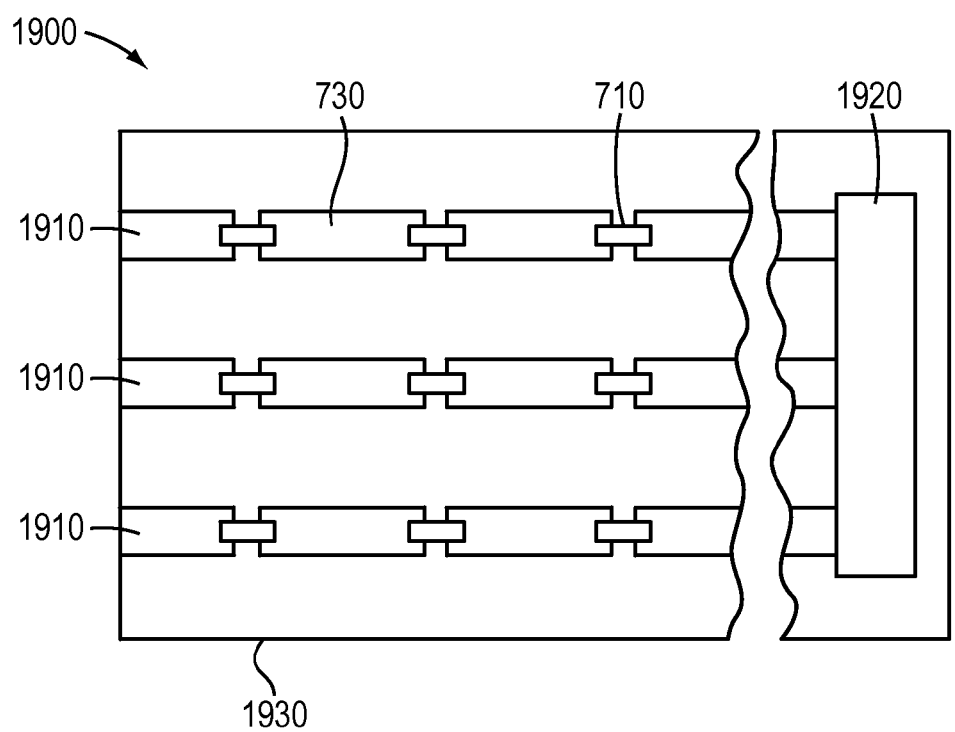
FIG. 19 is a plan-view schematic of a lighting apparatus incorporating multiple lighting devices and phosphor chips in accordance with various embodiments of the invention.

The systems described above may be combined with additional electronics to form an electronic device 1900 as shown in FIG. 19. In one embodiment, the device 1900 includes multiple LEEs 710 (incorporating phosphor chips 312, not shown for clarity) that are electrically coupled to traces 730. As shown, electronic device 1900 includes three serially-connected strings 1910 of LEEs 710. Electronic device 1900 also includes circuitry 1920 electrically connected to one or more of strings 1910. Circuitry 1920 may include or consist essentially of portions or substantially all of the drive circuitry, sensors, control circuitry, dimming circuitry, and or power-supply circuitry or the like, and may also be adhered (e.g., via an adhesive) or otherwise attached to a substrate 1930. In one embodiment, the power supply and driver are distributed, e.g., the device 1900 may have a centralized power supply and all or a portion of the drive circuitry distributed in different locations. Circuitry 1920 may even be disposed on a circuit board (e.g., a printed circuit board) that itself may be mechanically and/or electrically attached to substrate 1930. In other embodiments, circuitry 1920 is separate from substrate 1930. In some embodiments circuitry 1920 is formed on substrate 1930. While FIG. 19 depicts the LEEs 710 and serially connected in strings 1910, and strings 1910 connected or connectable in parallel, other die-interconnection schemes are possible and within the scope of embodiments of the invention.

As shown in FIG. 19, the lighting system 1900 may feature multiple strings, each string 1910 including or consisting essentially of a combination of one or more LEEs 710 electrically connected in series, in parallel, or in a series-parallel combination with optional fuses, antifuses, current-limiting resistors, zener diodes, transistors, and other electronic components to protect LEEs 710 from electrical fault conditions and limit or control the current flow through individual LEEs 710 or electrically-connected combinations thereof. In general, such combinations feature an electrical string that has at least two electrical connections for the application of DC or AC power. A string may also include a combination of one or more LEEs 710 electrically connected in series, in parallel, or in a series-parallel combination of LEEs 710 without additional electronic components. FIG. 19 shows three strings of LEEs 710, each string having three LEEs 710 in series; however, this is not a limitation of the present invention, and in other embodiments the number of strings is less than or greater than three and the number of LEEs 710 in a string may be greater or less than three. In one embodiment, a string includes at least ten LEEs 710. In one embodiment a string includes at least 45 LEEs 710. In one embodiment, system 1900 includes at least ten strings, or even at least 50 strings.

In some embodiments, the lighting systems described above further feature one or more optical elements. In some embodiments, one optical element is associated with each LEE 710, while in other embodiments multiple LEEs 710 are associated with one optical element, or multiple optical elements are associated with a single LEE 710, or no engineered optical element is associated with any LEE 710, and the LEE (and/or phosphor associated therewith) has only a flat or roughened surface. In one embodiment, the optical elements include features to scatter, diffuse and/or spread out light generated by the LEE 710 and/or phosphor 312. The optical elements may be formed by etching, polishing, grinding, machining, molding, embossing, extruding, casting, or the like. The method of formation of the optical elements is not a limitation of embodiments of the present invention.

Figure 20:
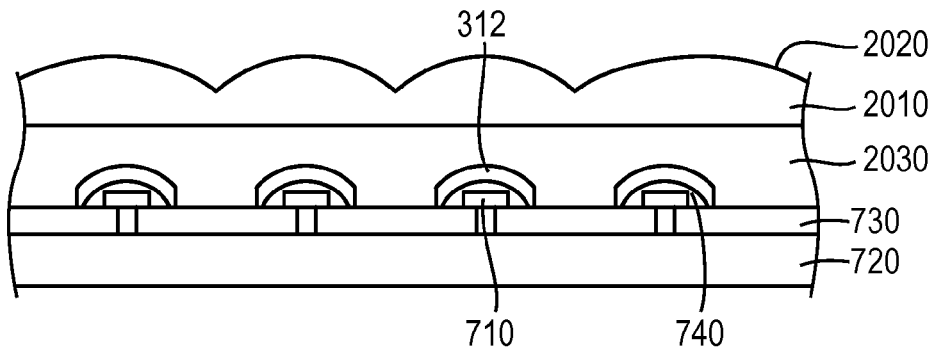
FIGS. 20-22 are cross-sectional schematics of lighting apparatuses incorporating multiple lighting devices and phosphor chips in accordance with various embodiments of the invention.
Figure 21:
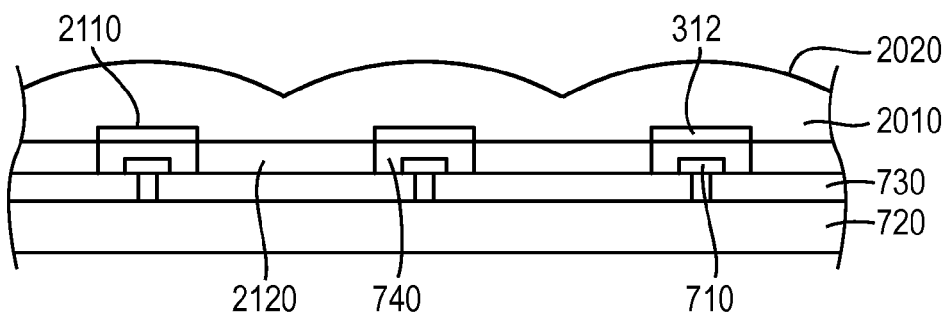
Figure 22:
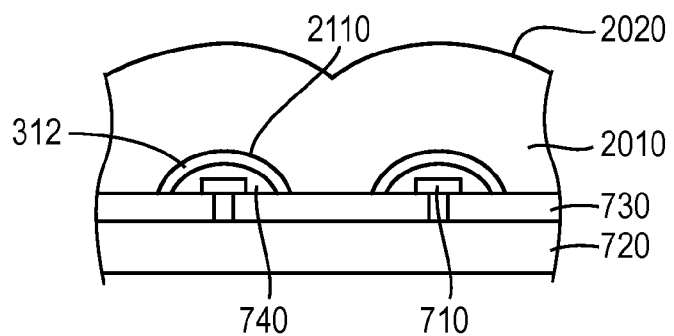

FIGS. 20-22 present different embodiments of the present invention that feature one or more optical elements. In FIG. 20, each LEE 710 and associated phosphor chip 312 has associated with it an optical element 2020 (each depicted as a portion of an optic 2010). Optic 2010 typically features an array of optical elements 2020; in some embodiments, one optical element 2020 is associated with each LEE 710, while in other embodiments multiple LEEs 710 are associated with one optical element 2020, or multiple optical elements 2020 are associated with a single LEE 710, or no engineered optical element is associated with any LEE 710, for example optic 2010 may be only a plate with a flat or roughened surface. In one embodiment, optic 2010 includes elements or features to scatter, diffuse and/or spread out light generated by LEE 710 and/or phosphor chip 312.

Optic 2010 may be substantially optically transparent or translucent. For example, optic 2010 may exhibit a transmittance greater than 80% for optical wavelengths ranging between approximately 400 nm and approximately 600 nm. In one embodiment, optic 2010 includes or consists essentially of a material that is transparent to a wavelength of light emitted by LEE 710 and/or phosphor chip 312. Optic 2010 may be substantially flexible or rigid. In some embodiments, optic 2010 includes multiple materials and/or layers. Optical elements 2020 may be formed in or on optic 2010. Optic 2010 may include or consist essentially of, for example, acrylic, polycarbonate, polyethylene naphthalate (PEN), polyethylene terephthalate (PET), polycarbonate, polyethersulfone, polyester, polyimide, polyethylene, glass or the like. Optical elements 2020 may be formed by etching, polishing, grinding, machining, molding, embossing, extruding, casting, or the like. The method of formation of optical elements 2020 is not a limitation of the present invention.

Optical elements 2020 associated with optic 2010 may all be the same or may be different from each other. Optical elements 2020 may include or consist essentially of, e.g., a refractive optic, a diffractive optic, a TIR optic, a Fresnel optic, or the like, or combinations of different types of optical elements. Optical elements 2020 may be shaped or engineered to achieve a specific light distribution pattern from the array of light emitters, phosphors and optical elements.

As used herein, "alignment" and "aligned" may mean that the center of one structure, for example LEE 710, is aligned with the center of another structure, for example optical element 2010; however, this is not a limitation of the present invention and in other embodiments alignment refers to a specified relationship between the geometries of multiple structures.

The space between the back side of optic 2010 and phosphor chip 312, conductive traces 730 and LEE substrate 720, designated as region 2030 in FIG. 20, may be a partial vacuum or be filled with air, filled with a fluid or other gas or filled or partially filled with one or more other materials. In one embodiment, region 2030 is filled or partially filled with a transparent material, similar to a material that may fill region 740 or that is used as the binder for phosphor chip 312, to reduce TIR losses in LEE 710 and to provide enhanced optical coupling between phosphor chip 312 and optic 2010.

In FIG. 21, optic 2010 incorporates depressions 2110 to accommodate or partially accommodate phosphor chips 312. Phosphor chips 312 may be formed or inserted into depressions 2110, for example using a pick-and-place tool. Phosphor chips 312 may be held in depressions 2110 mechanically, and/or with an adhesive or glue. In one embodiment, phosphor chips 312 are held in place by a transparent material similar to the binder or matrix used in phosphor chip 312. In one embodiment, depression 2110 is larger than phosphor chip 312. In one embodiment, depression 2110 is sized to just accommodate phosphor chip 312. A region 2120, similar to region 2030 in FIG. 20, may be a partial vacuum or be filled with air, filled with a fluid or other gas or filled or partially filled with one or more other materials. In one embodiment, region 2120 is filled or partially filled with a transparent material, similar to a material that may fill region 740 or that is used as the binder for phosphor chip 312, to provide reduced optical losses.

In FIG. 22 depressions 2110 in optic 2010 are curved such that phosphor chip 312 completely or substantially completely covers the top and sides of LEE 710. The periphery of the structures shown in FIGS. 20-22 may be sealed with an optional sealing material or materials. Such sealing may provide a barrier to external influences, for example humidity, corrosive ambients, etc. The seal may include or consist essentially of, for example, adhesive, glue, tape, or material such as that of material 2030, material 740, LEE substrate 720, or the like.

The examples discussed above show one LEE 710 associated with each phosphor chip 312. However, this is not a limitation of the present invention and in other embodiments a phosphor chip 312 is associated with multiple LEEs 710. Examples discussed above for phosphor chip 312 show phosphor chip 312 as being square and having sidewalls perpendicular to the sidewalls. However, this is not a limitation of the present invention, and in other embodiments phosphor chip 312 is rectangular, hexagonal, circular, triangular, or any arbitrary shape, and/or has sidewalls forming any angle with respect to the surface of phosphor chip 312.

While the phosphor chip has been used as part of a structure producing white light, this is not a limitation of the present invention, and in other embodiments, different color LEEs 710 and different phosphors (one or more) may be used to produce other colors, for example amber, green, or any arbitrary color or spectral power distribution. In some embodiments, the multiple LEEs 710 are all the same, while in other embodiments the multiple LEEs 710 include two or more groups of different LEEs 710, e.g., each emitting at different wavelengths.

Other embodiments of this invention have additional or fewer steps or components or may be modified or carried out in a different order. In general in the above discussion the arrays of light emitters, wells, optics and the like have been shown as square or rectangular arrays; however, this is not a limitation of the present invention and in other embodiments these elements are formed in other types of arrays, for example hexagonal, triangular or any arbitrary array. In some embodiments, these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for manufacture of an electronic device comprising:
   providing a solid, transparent, one-piece optic having a plurality of optical elements on a first side and a plurality of depressions defined by a second side opposite the first side, wherein at least one optical element is aligned with at least one depression;
   providing at least one phosphor chip, each phosphor chip (A) comprising (i) a light-conversion material present as a plurality of phosphorescent and/or fluorescent particles and (ii) a binder, comprising at least one of silicone or epoxy, wherein the phosphorescent and/or fluorescent particles are disposed within the binder, and (B) being a preformed, discrete solid piece;
   after providing the at least one phosphor chip and providing the optic, inserting each phosphor chip within a different depression in the optic;
   providing a substrate having a plurality of conductive traces on a surface thereof, each pair of conductive traces being separated on the substrate by a gap therebetween;
   providing a plurality of light-emitting elements (LEEs) each having (i) top and bottom opposed surfaces and (ii) first and second spaced-apart contacts disposed on the bottom surface, the optic being substantially transparent to at least one of a wavelength of light emitted by the LEEs or the at least one phosphor chip;
   for each LEE, (i) disposing the LEE over the substrate such that the bottom surface of the LEE extends across a gap disposed between a pair of conductive traces on the substrate and overlaps a portion of each of the conductive traces separated by the gap, (ii) electrically coupling the first contact of the LEE to one of the pair of conductive traces, and (iii) electrically coupling the second contact of the LEE to the other one of the pair of conductive traces; and
   after inserting each phosphor chip within a different depression in the optic and after electrically coupling the first and second contacts of each LEE to conductive traces, mating the substrate to the optic, whereby at least one phosphor chip is positioned to receive light from at least one LEE and each optical element is positioned to receive light from at least one LEE.

2. The method of claim 1, wherein at least one optical element comprises a refractive optic or a Fresnel optic.

3. The method of claim 1, wherein, for each optical element aligned with a depression, an optical axis of the optical element is aligned with a center of the depression.

4. The method of claim 1, wherein each phosphor chip is optically coupled to an optical element on the optic.

5. The method of claim 4, further comprising providing a material having an index of refraction greater than 1.35 between at least a portion of each phosphor chip and at least a portion of the optical element to which it is optically coupled.

6. The method of claim 1, wherein each phosphor chip is optically coupled to an LEE.

7. The method of claim 6, further comprising providing a material having an index of refraction greater than 1.35 between at least a portion of each phosphor chip and at least a portion of the LEE to which it is optically coupled.

8. The method of claim 1, wherein (i) the at least one phosphor chip comprises a plurality of phosphor chips, (ii) each phosphor chip has a thickness, and (iii) a variation in the thicknesses of the phosphor chips is less than ±5%.

9. The method of claim 1, wherein (i) the at least one phosphor chip comprises a plurality of phosphor chips, and (ii) each phosphor chip absorbs at least a portion of light emitted from the LEE from which it receives light and emits converted light having a different wavelength, converted light and unconverted light emitted by the LEE combining to form substantially white light.

10. The method of claim 9, wherein the substantially white light emitted collectively from the different LEEs and phosphor chips has a color temperature variation less than four MacAdam ellipses.

11. The method of claim 1, further comprising electrically connecting at least one LEE to circuitry for powering the at least one LEE.

12. The method of claim 1, further comprising electrically connecting at least one LEE to circuitry for controlling optical output characteristics of the at least one LEE and the phosphor chip positioned to receive light therefrom.

13. The method of claim 12, wherein the optical output characteristic comprises at least one of chromaticity, luminous flux, correlated color temperature, color point, or color rendering index.

14. The method of claim 1, wherein each optical element is positioned to receive light from only one LEE.

15. The method of claim 1, wherein the first and second contacts of each LEE are electrically coupled to conductive traces with at least one of a conductive adhesive, an anisotropic conductive adhesive, or solder.

16. The method of claim 15, wherein (i) the first and second contacts of each LEE are electrically coupled to conductive traces with an anisotropic conductive adhesive, and (ii) a portion of the anisotropic conductive adhesive is disposed in the gap between electrical traces and substantially electrically isolates the first contact from the second contact.

17. The method of claim 1, wherein each LEE comprises a bare LED die.

18. The method of claim 1, wherein the at least one phosphor chip comprises an indentation into which an LEE is at least partially disposed when the substrate is mated to the optic, the indentation being present before the LEE is at least partially disposed therewithin.

19. The method of claim 1, wherein at least a portion of the at least one phosphor chip has a curved shape.

20. The method of claim 1, wherein each phosphor chip is substantially cured before being inserted within a different depression in the optic.

21. The method of claim 1, wherein (i) at least one LEE has a top surface, a bottom surface opposite the top surface, and at least one sidewall spanning the top and bottom surfaces, (ii) the at least one phosphor chip is disposed over the top surface of the at least one LEE but does not contact any of the at least one sidewalls of the at least one LEE.

22. The method of claim 1, further comprising providing an adhesive agent between each phosphor chip and at least one LEE to bond the phosphor chip thereto, the adhesive agent being distinct from the phosphor chip.

23. The method of claim 1, further comprising securing each phosphor chip in place mechanically with a clip or a frame disposed proximate at least one LEE.

24. The method of claim 1, wherein each phosphor chip is inserted into a different depression in the optic with a pick-and-place tool.

25. The method of claim 1, wherein providing the at least one phosphor chip comprises:
    disposing within a mold a phosphor comprising the binder and the light-conversion material;
    curing the phosphor; and
    thereafter, removing the cured phosphor from the mold to provide the at least one phosphor chip.

26. The method of claim 25, wherein the at least one phosphor chip comprises a plurality of phosphor chips, further comprising, after the cured phosphor is removed from the mold, dividing the cured phosphor into pieces, each piece being a phosphor chip.

27. The method of claim 1, further comprising disposing a transparent material between at least one LEE and the at least one phosphor chip such that, after the substrate is mated to the optic, the at least one LEE is spaced away from the at least one phosphor chip by the transparent material.

28. The method of claim 1, wherein the binder of each phosphor chip comprises therewithin one or more materials for scattering light.

29. The method of claim 28, wherein the one or more materials for scattering light comprises at least one of fumed silica or alumina.

30. The method of claim 1, wherein the plurality of phosphorescent and/or fluorescent particles comprises at least one of lutetium aluminum garnet or yttrium aluminum garnet.

\* \* \* \* \*